(12) United States Patent
Ohnuma et al.

(10) Patent No.: US 7,579,220 B2
(45) Date of Patent: Aug. 25, 2009

(54) SEMICONDUCTOR DEVICE MANUFACTURING METHOD

(75) Inventors: Hideto Ohnuma, Kanagawa (JP); Masaharu Nagai, Kanagawa (JP); Mitsuaki Osame, Kanagawa (JP); Masayuki Sakakura, Kanagawa (JP); Shigeki Komori, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 400 days.

(21) Appl. No.: 11/383,694

(22) Filed: May 16, 2006

(65) Prior Publication Data

US 2006/0261336 A1 Nov. 23, 2006

(30) Foreign Application Priority Data

May 20, 2005 (JP) ............................. 2005-148836
May 23, 2005 (JP) ............................. 2005-150271

(51) Int. Cl.
*H01L 21/00* (2006.01)
(52) U.S. Cl. ................. 438/149; 438/151; 438/164; 257/E51.006; 257/E21.4
(58) Field of Classification Search ................. 438/149, 438/151–155, 162, 164
See application file for complete search history.

(56) References Cited

U.S. PATENT DOCUMENTS

| | | | |
|---|---|---|---|
| 4,818,715 A | 4/1989 | Chao | |
| 5,371,025 A | 12/1994 | Sung | |
| 5,744,381 A | 4/1998 | Tabata et al. | |
| 6,071,652 A | 6/2000 | Feldman et al. | |
| 6,335,290 B1 | 1/2002 | Ishida | |
| 6,365,917 B1 | 4/2002 | Yamazaki | |
| 6,420,073 B1 | 7/2002 | Suleski et al. | |
| 6,515,336 B1 | 2/2003 | Suzawa et al. | |
| 6,534,425 B1 | 3/2003 | Karr et al. | |
| 6,534,826 B2 | 3/2003 | Yamazaki | |

(Continued)

FOREIGN PATENT DOCUMENTS

EP   1 003 223 A2   5/2000

(Continued)

OTHER PUBLICATIONS

Kim et al.; "A Novel Four-Mask-Count Process Architecture for TFT-LCDs"; *SID 00 Digest*; pp. 1006-1009; 2000.

*Primary Examiner*—Hsien-ming Lee
(74) *Attorney, Agent, or Firm*—Fish & Richardson P.C.

(57) ABSTRACT

It is an object of the present invention to form a plurality of elements in a limited area to reduce the area occupied by the elements for integration so that further higher resolution (increase in number of pixels), reduction of each display pixel pitch with miniaturization, and integration of a driver circuit that drives a pixel portion can be advanced in semiconductor devices such as liquid crystal display devices and light-emitting devices that has EL elements. A photomask or a reticle provided with an assist pattern that is composed of a diffraction grating pattern or a semi-transparent film and has a function of reducing a light intensity is applied to a photolithography process for forming a gate electrode to form a complicated gate electrode. In addition, a top-gate TFT that has the multi-gate structure described above and a top gate TFT that has a single-gate structure can be formed on the same substrate just by changing the mask without increasing the number of processes.

24 Claims, 21 Drawing Sheets

U.S. PATENT DOCUMENTS

| | | |
|---|---|---|
| 6,541,294 B1 | 4/2003 | Yamazaki et al. |
| 6,613,620 B2 | 9/2003 | Fujimoto et al. |
| 6,638,667 B2 | 10/2003 | Suleski et al. |
| 6,646,287 B1 | 11/2003 | Ono et al. |
| 6,660,462 B1 | 12/2003 | Fukuda |
| 6,664,145 B1 | 12/2003 | Yamazaki et al. |
| 6,670,284 B2 | 12/2003 | Yin |
| 6,707,068 B2 | 3/2004 | Fujimoto et al. |
| 6,773,996 B2 | 8/2004 | Suzawa et al. |
| 6,828,586 B2 | 12/2004 | Fujimoto et al. |
| 6,872,604 B2 | 3/2005 | Yamazaki et al. |
| 6,884,664 B2 | 4/2005 | Fujimoto et al. |
| 6,909,114 B1 | 6/2005 | Yamazaki |
| 7,169,656 B2 | 1/2007 | Ohnuma et al. |
| 7,223,643 B2 | 5/2007 | Ohnuma et al. |
| 7,316,946 B2 | 1/2008 | Ohnuma et al. |
| 2001/0019127 A1 | 9/2001 | Ishida |
| 2002/0025591 A1 | 2/2002 | Ohnuma et al. |
| 2002/0146627 A1 | 10/2002 | Suleski et al. |
| 2002/0160547 A1 | 10/2002 | Shih |
| 2004/0065902 A1 | 4/2004 | Yamazaki et al. |
| 2005/0161672 A1 | 7/2005 | Yamazaki et al. |
| 2005/0161674 A1 | 7/2005 | Fujimoto et al. |
| 2006/0014335 A1 | 1/2006 | Ohnuma et al. |
| 2007/0218604 A1 | 9/2007 | Ohnuma et al. |
| 2008/0119024 A1 | 5/2008 | Ohnuma et al. |

FOREIGN PATENT DOCUMENTS

| | | |
|---|---|---|
| EP | 1 058 311 A2 | 12/2000 |
| JP | 10-032327 | 2/1998 |
| JP | 2001-051622 | 2/2001 |
| JP | 2001-094113 | 4/2001 |
| JP | 2002-151523 | 5/2002 |
| JP | 2002-203862 | 7/2002 |

SEMICONDUCTOR DEVICE MANUFACTURING METHOD

BACKGROUND OF THE INVENTION

1. Field of Invention

The present invention relates to a semiconductor device that has a circuit composed of thin film transistors (hereinafter referred to as TFTs) and a manufacturing method thereof, and for example, relates to an electronic device equipped with, as a component, an electro-optical device typified by a liquid crystal display panel or a light-emitting display device that has an organic light-emitting element.

It is to be noted that the semiconductor device in the specification refers to devices in general that can function by utilizing semiconductor characteristics, and electro-optical devices, semiconductor circuits, and electronic devices are all semiconductor devices.

2. Description of the Related Art

In these years, a technique of making thin film transistors (TFTs) by using a semiconductor thin film (on the order of several to several hundreds nanometers in thickness) formed on a substrate with an insulating surface has been attracting attention. The thin film transistors are widely applied to electronic devices such as ICs and electro-optical devices, and have been quickly developed in particular as switching elements for image display devices.

In particular, active matrix display devices (such as liquid crystal display devices or light-emitting display devices) in which a switching element of a TFT is provided for each of display pixels arranged in a matrix have been actively developed.

In active matrix display devices, developments for expanding effective screen regions in pixel portions have been advanced. In order to make the area of an effective screen region larger, it is really necessary to make the area occupied by TFTs arranged in a pixel portion (pixel TFTs) smaller as much as possible. In addition, in order to reduce manufacturing costs, developments for forming a driver circuit on the same substrate with a pixel portion have been also advanced. Above all, a TFT using a polysilicon film has a higher field-effect mobility than a TFT using an amorphous silicon film, and thus can operate at a higher speed.

In a module that is mounted on the display device, a pixel portion that displays images for each function block and a driver circuit for controlling the pixel portion, such as a shift register circuit, a level shifter circuit, a buffer circuit, and a sampling circuit are CMOS circuits in many cases, are formed on one substrate.

When a driver circuit and a pixel portion are formed on the same substrate, the area occupied by a region except a pixel portion, which is called a frame portion, tends to be larger as compared with mounting of a driver circuit by a TAB method. In order to make the area of the frame portion smaller, it is also really necessary to reduce the scale of circuits constituting the driver circuit.

In particular, for a light-emitting display device that has organic light-emitting elements (EL elements) arranged in a matrix, a plurality of TFTs that have different roles is required for one pixel. In addition, also for a liquid crystal display device, an attempt to form TFTs for switching and a memory element such as an SRAM in one pixel has been made. In addition, in the case of forming a pixel portion and a driver circuit on the same substrate, miniaturization as much as possible is desired.

In Japanese Patent Laid-Open No. 2001-51622, the use of a TFT that has a multi-gate structure (a structure that uses a semiconductor layer with two or more channel forming regions connected in series as an active layer) in an EL display device is described.

In addition, in Japanese Patent Laid-Open No. 2002-151523, a manufacturing process for a TFT is described in which a photomask or a reticle provided with an assist pattern that is composed of a diffraction grating pattern or a semi-transparent film and has a function of reducing a light intensity is applied to a photolithography process for forming a gate electrode.

In addition, in Japanese Patent Laid-Open No. 2002-203862, a manufacturing process for a TFT is described in which, with respect to a gate electrode that has a two-layer structure composed of different conductive materials, a first layer that is the lower layer of the gate electrode has a larger electrode width than a second layer of the gate electrode and doping a semiconductor layer through a portion of the first layer is carried out.

SUMMARY OF THE INVENTION

It is an object of the present invention to provide a semiconductor device provided with a circuit with a high operation performance and high reliability, and it is an object of the present invention to improve the reliability of an electronic device provided with the semiconductor device by improving the reliability of the semiconductor device. In addition, it is an object of the present invention to simplify a manufacturing process for the semiconductor device to reduce the manufacturing costs.

In addition, it is an object of the present invention to form a plurality of elements in a limited area to reduce the area occupied by the elements for integration so that further higher resolution (increase in number of pixels), reduction of each display pixel pitch with miniaturization, and integration of a driver circuit that drives a pixel portion can be advanced in electro-optical devices typified by liquid crystal display devices, light-emitting devices that have EL elements, and semiconductor devices. Furthermore, it is an object of the present invention to improve image quality of electro-optic devices or light-emitting devices or to improve product quality of electronic devices equipped with such devices by integrating various circuits for reduction in size.

The present invention provides a novel TFT that has a multi-gate structure, which has a low off current value and suppresses degradation caused by hot carrier injection. It is to be noted that the off current value is the value of a current flowing through the transistor due to charge leak during non-selection (during an off state) when the transistor is a switching element.

Specifically, in the case of a double-gate TFT that has two channel forming regions, a structure is employed which includes the channel length of the TFT and has a gate electrode with a central portion and end portions thinned in electrode thickness in the cross section structure along the plane perpendicular to the principal plane of the substrate. Further, a semiconductor layer that is overlapped with the thin portions of the gate electrode with a gate insulating film interposed therebetween is doped with an impurity element that gives an n-type or p-type conductivity to form three impurity regions located apart from each other by providing the impurity regions. It is to be noted that channel forming regions are located among the respective three impurity regions. The gate electrode has two thick portions provided with the central portion sandwiched therebetween, and a first channel forming region (channel length: L1) that is overlapped with one of the thick portions of the gate electrode with the gate insulating film interposed therebetween and a channel forming region (channel length: L2) that is overlapped with the other of the thick portions of the gate electrode with the gate insulating film interposed therebetween are provided.

In addition, a source region and a drain region are provided in the semiconductor layer located outside the gate electrode. In addition, an interlayer insulating film is provided above the gate electrode and the gate insulating film. In addition, a source wiring is provided on the interlayer insulating film, and the source region and the source wiring are electrically connected to each other through a contact hole reaching the source region. In addition, a drain wiring is similarly provided on the interlayer insulating film, the drain region and the drain wiring are electrically connected to each other through a contact hole reaching the drain region.

In addition, the present invention is not limited to a double-gate transistor that has two channel forming regions, and TFTs that have multiple kinds of multi-gate structures and are different in the number of channel forming regions can be manufactured on the same substrate. In addition, a double-gate transistor and a single gate transistor can be provided on the same substrate without increasing the number of processes. Accordingly, various circuits can be made up by applying transistors that have the most appropriate structures.

The present invention is effective in the case of arranging transistors that have multi-gate structures in a pixel portion, and the area occupied by the transistors that have the multi-gate structures in the pixel portion can be reduced for integration. In addition, the effective image display area can be sufficiently secured to enable higher resolution.

When a driver circuit and a pixel portion are formed on the same substrate, the area occupied by a region except a pixel region, which is called a frame portion, tends to be larger as compared with mounting a driver circuit by a TAB method.

The present invention is effective in the case of arranging transistors that have multi-gate structures in a portion of a driver circuit that drives a pixel portion, and the area occupied by the driver circuit can be reduced for integration. The present invention allows reduction in frame portion (narrowed frame).

The specification discloses an aspect of the present invention, which is a semiconductor device including: a semiconductor layer that has two or more channel forming regions connected in series above a substrate with an insulating surface; a gate insulating layer above the semiconductor layer; and a gate electrode comprising laminated layers of conductive layers on the gate insulating layer, wherein the semiconductor layer has a source region, a drain region, a first channel forming region and a second channel forming region between the source region and the drain region, and an intermediate impurity region between the first channel forming region and the second channel forming region, wherein a first conductive layer constituting one of the laminated layers of the gate electrode is overlapped with at least the first channel forming region, the intermediate impurity region, and the second channel forming region, wherein a second conductive layer constituting one of the laminated layers of the gate electrode has contact with the first conductive layer and is overlapped with the first channel forming region, and wherein a third conductive layer constituting one of the laminated layers of the gate electrode has contact with the first conductive layer, is located apart from the second conductive layer, and is overlapped with the second channel forming region.

In addition, in the aspect described above, it is one of the features that the second conductive layer and the third conductive layer have the same material.

In addition, in each aspect described above, it is one of the features that the first conductive layer and the second conductive layer have different materials.

In addition, in each aspect described above, it is one of the features that the first conductive layer has a width that is larger than a value obtained by adding the width of the first channel forming region, the width of the second channel forming region, and the width of the intermediate impurity region.

In addition, in each aspect described above, it is one of the features that the width of the second conductive layer is equal to the width of the first channel forming region.

In addition, in each aspect described above, it is one of the features that the width of the third conductive layer is equal to the width of the second channel forming region.

In addition, in each aspect described above, it is one of the features that the film thickness of the first conductive layer is thinner than the second conductive layer and the third conductive layer.

In addition, in each aspect described above, it is one of the features that the source region and the drain region are located outside the first conductive layer.

Further, another aspect of the present invention is a semiconductor device including: a semiconductor layer that has two or more channel forming regions connected in series above a substrate with an insulating surface; a gate insulating layer above the semiconductor layer; and a gate electrode comprising laminated layers of conductive layers on the gate insulating layer, wherein the semiconductor layer has a pair of higher concentration impurity regions, a first channel forming region and a second channel forming region between the pair of higher concentration impurity regions, a first lower concentration impurity region between one of the higher concentration impurity regions and the first channel forming region, a second lower concentration impurity region between the other of the higher concentration impurity regions and the second channel forming region, and an intermediate impurity region between the first channel forming region and the second channel forming region, wherein a first conductive layer constituting one of the laminated layers of the gate electrode is overlapped with at least the first lower concentration impurity region, the first channel forming region, the intermediate impurity region, the second lower concentration impurity region, and the second channel forming region, wherein a second conductive layer constituting one of the laminated layers of the gate electrode has contact with the first conductive layer and is overlapped with the first channel forming region, and wherein a third conductive layer constituting one of the laminated layers of the gate electrode has contact with the first conductive layer, is located apart from the second conductive layer, and is overlapped with the second channel forming region.

In addition, in the aspect described above, it is one of the features that the first lower concentration impurity region and the second lower concentration impurity region include the same concentration of n-type or p-type impurity element.

In addition, in the aspect described above, it is one of the features that the intermediate impurity region includes the same concentration of n-type or p-type impurity element as that of the first lower concentration impurity region or the second lower concentration impurity region.

In addition, in the aspect described above, it is one of the features that the width of the first lower concentration impurity region is equal to the width of the second lower concentration impurity region.

In addition, in the aspect described above, it is one of the features that the second conductive layer and the third conductive layer have the same material.

In addition, in the aspect described above, it is one of the features that the first conductive layer and the second conductive layer have different materials.

In addition, in the aspect described above, it is one of the features that the first conductive layer has a width obtained by adding the width of the first channel forming region, the width of the second channel forming region, the width of the intermediate impurity region, the width of the first lower concentration impurity region, and the width of the second lower concentration impurity region.

In addition, in the aspect described above, it is one of the features that the width of the second conductive layer is equal to the width of the first channel forming region.

In addition, in the aspect described above, it is one of the features that the width of the third conductive layer is equal to the width of the second channel forming region.

In addition, in the aspect described above, it is one of the features that the film thickness of the first conductive layer is thinner than the second conductive layer and the third conductive layer.

In addition, in the aspect described above, it is one of the features that the pair of higher concentration impurity regions is located outside the first conductive layer.

In addition, a manufacturing process is also one aspect of the present invention, in which in order to achieve the aspect described above, a photomask or a reticle provided with an assist pattern that is composed of a diffraction grating pattern or a semi-transparent film and has a function of reducing a light intensity is applied to a photolithography process for forming a gate electrode to form a complicated gate electrode. In addition, the photomask or reticle provided with slits of the resolution limit or less may be used to form a gate electrode that has a complicated shape. The use of a photomask or a reticle provided with an assist pattern that is composed of a diffraction grating pattern or a semi-transparent film and has a function of reducing a light intensity allows a complicated gate electrode to be formed without increasing the number of processes. The present invention allows a manufacturing process for a semiconductor device to be simplified and also allows the manufacturing costs to be reduced.

An aspect of the present invention with respect to a manufacturing process, which is a method for manufacturing a semiconductor device, including the steps of forming an insulating film on a semiconductor layer; forming a first conductive film on the insulating film; forming a second conductive film on the first conductive film; forming a resist pattern on the second conductive film above the semiconductor layer, the resist pattern having thin end portions and a thin central portion; carrying out etching to form a first conductive layer with a first width above the semiconductor layer and form a second conductive layer and a third conductive layer that are located apart from each other on the first conductive layer; doping the semiconductor layer with an impurity element by using the first conductive layer as a mask to form a pair of higher concentration impurity regions in the semiconductor layer located outside the first conductive layer; and doping the semiconductor layer with an impurity element by using the second conductive layer and the third conductive layer as a mask to form a lower concentration impurity regions in the semiconductor layer overlapped with the first conductive layer.

In addition, in the aspect described above, it is one of the features that the first conductive layer is formed by etching the first conductive film and the second conductive layer and the third conductive layer are formed by etching the second conductive film.

In addition, in the aspect described above, it is one of the features that the width of the first conductive layer is wider than the sum of the width of the second conductive layer and the width of the third conductive layer.

In addition, in the aspect described above, it is one of the features that the resist pattern is formed by using a photomask or a reticle that has a diffraction grating pattern or a semi-transparent film.

In addition, in the aspect described above, it is one of the features that the first conductive layer, the second conductive layer, and the third conductive layer serve as a gate electrode.

In addition, the present invention is not limited to the formation of a gate electrode, and can be applied to various wirings and electrodes that are used in semiconductor integrated circuits. For example, a photomask or a reticle that has a diffraction grating pattern or a semi-transparent film can be used to make a source electrode, a drain wiring, a connecting electrode, and the like of a thin film transistor which have complicated shapes without increasing the number of processes. Of course, photomasks or reticles that have a diffraction grating pattern or a semi-transparent film can be used in a plurality of processes, and various wirings and electrodes that are used in semiconductor integrated circuits can be thus formed.

It is also one aspect of the present invention that a photomask or a reticle that has a diffraction grating pattern or a semi-transparent film is used for a connecting electrode between a transparent conductive film (a pixel electrode, or an anode or a cathode of a light-emitting element) and a thin film transistor, and another aspect of the present invention with respect to a manufacturing process, which is a method for manufacturing a semiconductor device, including the steps of forming an insulating film covering a semiconductor layer; laminating a first conductive film, a second conductive film, and a third conductive film on the insulating film; forming a resist pattern that is partially different in film thickness on the third conductive film; carrying out etching to form an electrode that has a portion where the first conductive film, the second conductive film, and the third conductive film are laminated and a portion of a single layer of the first conductive film; and forming a transparent conductive film on the insulating film, the transparent conductive film overlapping in contact with the upper surface of the portion of the single layer of the first conductive layer.

In addition, in the aspect described above, it is one of the features that the resist pattern is formed by using a photomask or a reticle that has a diffraction grating pattern or a semi-transparent film. For example, a photomask or a reticle that has a diffraction grating pattern or a semi-transparent film can be used to form a complex electrode. As for the electrode, the connecting electrode has three layers, and a transparent conductive film overlapping in contact with only a portion of a single layer of a first conductive layer that is the lowest layer can be formed.

In addition, in the aspect described above, it is one of the features that the resist pattern that is partially different in film thickness has a portion with a first film thickness and a portion with a second film thickness thinner than the first film thickness, and the portion that has the second film thickness is an end portion of the resist pattern.

In addition, in the aspect described above, it is one of the features that the first conductive film has contact with a portion of the semiconductor layer through a contact hole formed in the insulating film.

In addition, in the aspect described above, it is one of the features that the first conductive film is a high melting point metal element or a high melting point metal compound. A transparent conductive film can have a high contact resistance depending on the type of a metal material in contact with the transparent conductive film. For example, aluminum and ITO cause galvanic corrosion to increase the contact resistance. When first and second layers of a connecting electrode are a high melting point metal and aluminum, respectively, the ITO can be connected to the high melting point metal that is the lowest layer without contact with the aluminum.

In addition, in the aspect described above, it is one of the features that the second conductive film is formed of an aluminum element or an aluminum compound.

In addition, in the aspect described above, it is one of the features that the third conductive film is formed of a high melting point metal element or a high melting point metal compound.

In addition, the semiconductor layer that serves as an active layer of a transistor is formed by using a semiconductor film including a crystalline structure, namely, which may be a single-crystal semiconductor film, a polycrystalline semiconductor film, or a microcrystalline semiconductor film.

Alternatively, a semiconductor substrate can be also used as the semiconductor layer that serves as an active layer of a transistor. The semiconductor substrate is a single-crystal substrate or a compound semiconductor substrate, and typically an n-type or p-type single-crystal silicon substrate, a GaAs substrate, an InP substrate, a GaN substrate, a SiC substrate, a sapphire substrate, or a ZnSe substrate. In the case of using a semiconductor substrate, an n-type well and a p-type well are selectively formed in a first element forming region and a second element forming region of a principal surface (a element forming surface or a circuit forming surface) of the substrate, respectively. Then, a field oxide film that serves as an element separating region for partitioning a plurality of element forming regions is formed. The field oxide film is a thick thermal oxide film, and may be formed by using a known LOCOS method. It is to be noted that the element separating method is not limited to the LOCOS method, and for example, the element separating region may have a trench structure obtained by using a trench separating method. Alternatively, the LOCOS structure may be combined with the trench structure. Then, for example, a gate insulating film is formed by thermally oxidizing the surface of the silicon substrate. The gate insulating film may be formed by using CVD, and a silicon oxynitride film, a silicon oxide film, a silicon nitride film, and laminated film thereof can be used.

Light-emitting elements using electroluminescence, which are used for a display device and so on, are classified depending on whether a luminescent material is an organic compound or an inorganic compound, and typically, the former is referred to as an organic EL element, and the latter is referred to as an inorganic EL element. Using a semiconductor device according to the present invention, a light-emitting display device can be manufactured by using any of an organic EL element and an inorganic EL element.

Inorganic EL elements are classified in a dispersive inorganic EL element and a thin-film inorganic EL element. There is a difference in that the former has an electroluminescent layer in which particles of a luminescent material are dispersed in a binder while the latter has an electroluminescent layer composed of a thin film of a luminescent material. However, it is common for the both to require electrons accelerated in high electric field. It is to be noted that there are donor-acceptor recombination luminescence using a donor level and an acceptor level and local luminescence using inner shell electron transition of a metal ion as mechanisms for luminescence obtained. In general, it is often the case that the dispersive inorganic EL element produces donor-acceptor recombination luminescence and the thin-film inorganic EL element produces local luminescence.

It is to be noted that all layers formed between an anode and a cathode of an organic EL element are defined as an organic light-emitting layer in the specification. The organic light-emitting layer specifically includes a light-emitting layer, a hole injecting layer, an electron injecting layer, a hole transporting layer, an electron injecting layer, and the like. Basically, an organic EL element has a structure in which an anode, a light-emitting layer, and a cathode are laminated in order, or besides this structure, may have a structure in which an anode, a hole injecting layer, a light-emitting layer, and a cathode are laminated in order or a structure in which an anode, a hole injecting layer, a light-emitting layer, an electron transporting layer, and a cathode are laminated in order.

An organic EL element has a layer (hereinafter referred to as an organic light-emitting layer) including an organic compound (an organic luminescent material) that provides luminescence (Electroluminescence) generated by applying an electric field, an anode, and a cathode. Luminescence in an organic compound includes luminescence when returning from a single excited state to the ground state (fluorescence) and luminescence when returning from a triplet excited state to the ground state (phosphorescence). In the case of manufacturing a light-emitting display device, any one or both of the luminescences described above may be used.

In a light-emitting device, a plurality of TFTs that have different roles are required for one pixel. Therefore, when TFTs that have a multi-gate structure are arranged in a pixel portion, the present invention allows the area occupied by the TFTs that have the multi-gate structure to be reduced for integration, and allows a high-definition light-emitting device to be realized.

Also in a liquid crystal display device, the present invention allows a switching TFT and a memory element (an SRAM, a DRAM, or the like) composed of an inverter circuit to be formed in a small area in one pixel so that the area of the effective screen region can be made larger and further, the size of one pixel can be made smaller. Therefore, a high-definition liquid crystal display device can be achieved.

In addition, the present invention allows the withstand voltage of a TFT that has a multi-gate structure to be improved, and allows the reliability of a semiconductor device provided with the TFT that has the multi-gate structure to be improved. Additionally, the reliability of an electronic device provided with the semiconductor device can be improved by improving the reliability of the semiconductor device.

DETAILED DESCRIPTION OF THE INVENTION

Figure 1A:
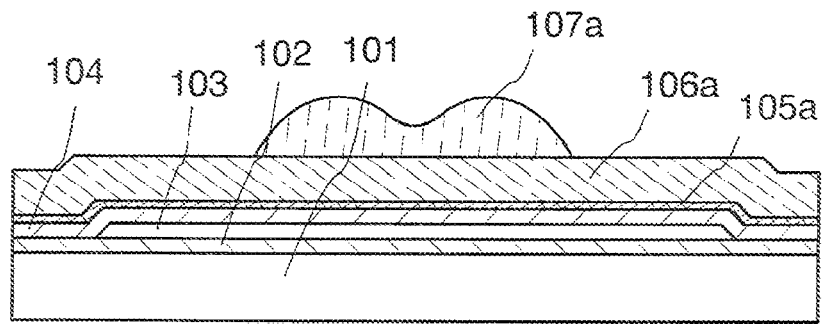
FIGS. 1A to 1D are cross-sectional views showing a process of manufacturing a semiconductor device according to the present invention (Embodiment Mode 1)

Embodiment modes of the present invention will be described in detail below with reference to the drawings. It is to be noted that the present invention is not to be considered limited to the following embodiment modes, and various changes may be made without departing from the scope of the invention.

Embodiment Mode 1

The present embodiment mode describes a process for using a gate electrode of a TFT that has a double-gate structure as a mask during ion doping to form impurity regions in a self-alignment manner and make the distance between two channel forming regions in a TFT less than 2 μm.

First, a first insulating film (base insulating film) 102 is formed on a substrate 101 with an insulating surface. As the substrate 101 with the insulating surface, a light-transmitting substrate, for example, a glass substrate, a crystallized glass substrate, or a plastic substrate can be used. When a thin film transistor to be formed later is applied to a top-emission light-emitting display device, or applied to a reflective liquid crystal display device, a ceramics substrate, a semiconductor substrate, a metal substrate, and the like can also be used.

As the first insulating film 102, an insulating film such as a silicon oxide film, a silicon nitride film, or a silicon oxynitride film ($SiO_xN_y$) is used. Then, a semiconductor layer 103 is formed on the first insulating film 102.

The semiconductor layer 103 is formed in such a way that a semiconductor film that has an amorphous structure is formed by a known method (such as sputtering, LPCVD, or plasma CVD), a crystallized crystalline semiconductor film is formed by a heat treatment, and after forming a resist film on the crystalline semiconductor film, a first resist mask obtained by exposure and development is used to carry out patterning in a desired shape.

This semiconductor layer 103 is formed to have a thickness of 25 to 80 nm (preferably 30 to 70 nm). The material for the crystalline semiconductor film is not limited. However, the crystalline semiconductor film is preferably formed by using silicon, a silicon-germanium (SiGe) alloy, or the like.

For the heat treatment mentioned above, a heating furnace, laser irradiation, irradiation with light that is emitted from a lamp (hereinafter referred to as lamp anneal) instead of laser light, or a combination thereof can be used.

Alternatively, the crystalline semiconductor film may be formed by thermal crystallization of carrying out the heat treatment mentioned above after adding a catalyst such as nickel. It is to be noted that when crystallization is carried out by thermal crystallization using a catalyst such as nickel to obtain a crystalline semiconductor film, it is preferable to carry out a gettering treatment of removing the catalyst such as nickel after crystallization.

Alternatively, in the case of manufacturing a crystalline semiconductor film by laser crystallization, a continuous wave oscillation laser beam (a CW laser beam) and a pulsed oscillation laser beam (a pulsed laser beam) can be used. As laser beams that can be used here, laser beams emitted from one or more kinds of gas lasers such as an Ar laser, a Kr laser, and an excimer laser; lasers using, as a medium, a single crystal of YAG, $YVO_4$, forsterite ($Mg_2SiO_4$), $YAlO_3$, or $GdVO_4$ or a polycrystal (ceramics) of YAG, $Y_2O_3$, $YVO_4$, $YAlO_3$, or $GdVO_4$ doped with one or more kinds of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. Irradiation with the fundamental waves of these laser beams and the second harmonic to fourth harmonic laser beams of these fundamental waves allows large crystals in grain size to be obtained. For example, the second harmonic (532 nm) and the third harmonic (355 nm) of a Nd:$YVO_4$ laser (fundamental wave: 1064 nm) can be used. The energy density of the laser in this case needs to be approximately 0.01 to 100 $MW/cm^2$ (preferably 0.1 to 10 $MW/cm^2$). Then, irradiation is carried out at a scanning Tate of approximately 10 to 2000 cm/sec.

Further, for a laser using, as a medium, a single crystal of YAG, $YVO_4$, forsterite ($Mg_2SiO_4$), $YAlO_3$, or $GdVO_4$ or a polycrystal (ceramics) of YAG, $Y_2O_3$, $YVO_4$, $YAlO_3$, or $GdVO_4$ doped with one or more kinds of Nd, Yb, Cr, Ti, Ho, Er, Tm, and Ta as a dopant; an Ar laser; or a Ti:sapphire laser, continuous wave oscillation is possible. Also, pulsed oscillation at an oscillation frequency of 10 MHz or more is possible by carrying out Q-switch operation, mode locking, or the like. When pulsed oscillation at an oscillation frequency of 10 MHz or more is carried out, the semiconductor film is irradiated with the next pulse after melting of the semiconductor film by laser and before solidification thereof. Accordingly, in contrast to a case of using a pulsed laser at a lower oscillation frequency, the solid-liquid interface in the semiconductor film can be continuously moved, and a crystal grain grown continuously toward the scanning direction can be thus obtained.

The use of ceramics (a polycrystal) as the medium allows the medium to be formed in any shape at low cost in a short amount of time. While a columnar medium of several millimeters in diameter and several tens millimeters in length is typically used in the case of using a single crystal, larger mediums in size can be formed in the case of using ceramics.

Since the concentration of the dopant in the medium, such as Nd and Yb, which directly contributes luminescence, is not able to be significantly changed, improvement in laser power by increasing the concentration has a certain level of limitation. However, in the case of ceramics, drastic improvement in power can be expected since the size of the medium can be significantly increased as compared with single crystals.

Further, in the case of ceramics, a medium in the shape of a parallelpiped or a rectangular parallelpiped can be easily formed. When a medium in this shape is used to make emitted light travel in zigzags within the medium, the emitted light path can be made longer. Therefore, the amplification is increased to enable oscillation with large power. In addition, a laser beam that is emitted from a medium in this shape has a cross section of a quadrangular shape when the beam is emitted, and is therefore advantageous in shaping into a linear beam as compared with a circular shape. Shaping the thus emitted laser beam with the use of an optical system makes it possible to easily obtain a linear laser beam that has a shorter side of 1 mm or less in length and a longer side of several millimeters to several meters in length. In addition, irradiating the medium with excitation light makes the linear beam have a uniform energy distribution in the longer side direction.

Irradiation of the semiconductor film with this linear beam allows more uniform annealing of the entire semiconductor film. When uniform annealing is required to the both ends of the linear beam, an innovation of arranging slits at opposite ends for light-shielding against an energy attenuating portion, or the like is required.

When the obtained uniform intensity linear beam is used to anneal the semiconductor film and this semiconductor film is used to manufacture an electronic device, the electronic device has favorable and uniform characteristics.

Then, if necessary, doping with a slight mount of impurity element (boron or phosphorous) is carried out to the semiconductor layer to control the threshold voltage of the TFT. Ion doping with plasma excitation diborane ($B_2H_6$) without mass separation is used here.

Then, after removing the first resist mask, an oxide film is removed with an etchant containing hydrofluoric acid and at the same time, the surface of the semiconductor layer is cleaned with the etchant. Then, a second insulating film (a gate insulating film) 104 covering the semiconductor layer is formed. The second insulating film 104 is formed by plasma CVD, sputtering, or thermal oxidation to have a thickness of 1 to 200 nm, preferably 20 to 120 nm. As the second insulating film 104, a film composed of an insulating film such as a silicon oxide film, a silicon nitride film, or a silicon oxynitride film is formed. A silicon oxynitride film (composition ratio: Si=32%, O=59%, N=7%, and H=2%) is formed by plasma CVD here to have a thickness of 115 nm.

Then, laminated layers of a first conductive film 105a and a second conductive film 106b are formed, and a mask pattern 107a that serves as a second resist mask is formed. The processes described above provide a state shown in FIG. 1A.

In FIG. 1A, the first insulating film (base insulating film) 102, the semiconductor layer 103, and the second insulating film (gate insulating film) 104 are formed on the substrate 101, and the first conductive film 105a and the second conductive film 106a are formed thereon. The mask pattern 107a is formed by a light exposure process using photoresist.

It is to be noted that the use of a photomask or a reticle provided with an assist pattern that is composed of a diffraction grating pattern or a semi-transparent film and has a function of reducing a light intensity makes the mask pattern 107a have the shape shown in FIG. 1A, that is, a shape that includes the channel length of a TFT and has a central portion and end portions that are thin in film thickness in the cross section along the plane perpendicular to the principal plane of the substrate. In addition, the photomask or reticle provided with slits of the resolution limit or less may used to form a gate electrode that has the complicated shape described above. In addition, baking at about 200° C. may be carried out after development to deform the mask pattern 107a.

The first conductive film is formed to have a thickness of 10 to 50 nm by using a high melting point metal such as tungsten (W), chromium (Cr), tantalum (Ta), tantalum nitride (TiN), or molybdenum (Mo), or an alloy or compound including the high melting point metal as its main component. In addition, the second conductive film is formed to have a thickness of 100 to 600 nm by using a high melting point metal such as tungsten (W), chromium (Cr), tantalum (Ta), tantalum nitride (TiN), or molybdenum (Mo), or an alloy or compound including the high melting point metal as its main component.

The use of different conductive materials here for each of the first conductive film and the second conductive film results in a difference in etching rate in an etching process to be carried out later. A tantalum nitride film is used as the first conductive film, and a tungsten film is used as the second conductive film.

Figure 1B:
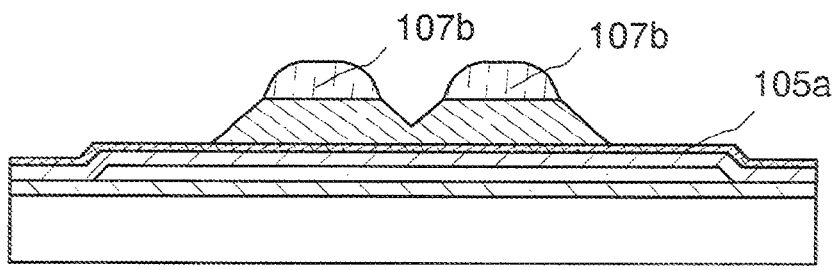

Next, as shown in FIG. 1B, etching of the second conductive film 106a is carried out by dry etching. For the etching gas, $CF_4$, $SF_6$, $Cl_2$, $O_2$ are used. For improving the etching rate, a dry etching system using high-density plasma source such as ECR (Electron Cyclotron Resonance) or ICP (Inductivity Coupled Plasma) is used. In addition, in the processed shape based on the mask pattern 107a, a negative bias voltage is applied to the substrate side in order to process an end or side wall portion into a tapered shape.

The mask pattern 107a formed by using the resist is sputtered by ions accelerated in an electric field to provide a divided mask pattern 107b.

Figure 1C:
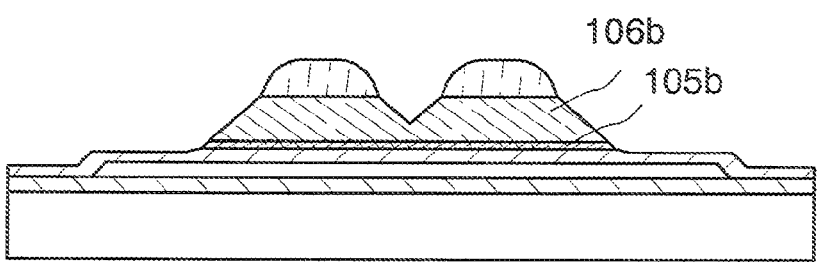

Next, as shown in FIG. 1C, the etching gas is changed to $CF_4$ and $Cl_2$ to carry out etching of tantalum nitride that is the first conductive film.

Thus, as shown in FIG. 1C, a first conductive laminated pattern composed of the first conductive layer 105b and the second conductive layer 106b is formed on the second insulating film 104. The angle formed by the taper shape and the surface of the substrate 101 at the end is made to be 10 to 30 degrees. This angle is determined mainly by the relation with the film thickness of the second conductive layer, and the length occupied by this taper portion is made to be approximately 0.2 to 1.5 μm, preferably 0.5 to 1 μm.

Figure 1D:
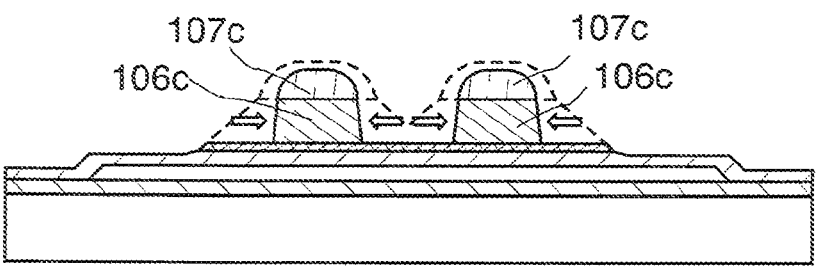

Then, with the use of $BCl_3$, $Cl_2$, and $O_2$ for an etching gas, the second conductive layer 106b is selectively etched in accordance with the mask pattern 107b. The mask pattern 107b formed by using the resist is sputtered by ions accelerated in an electric field to provide a mask pattern 107c further reduced in size. In the etching here, the bias voltage that is applied to the substrate side is made lower so that the first conductive layer 105b remains. The ends of the second conductive layer and the third conductive layer 106c are made to back up inside more than that of the first conductive layer 105b, and the length of an Lov (a lower-concentration impurity region overlapped with a gate electrode) is determined by the length of the back space as described later. Thus, a second conductive laminated pattern composed of the first conductive layer 105b and the second conductive layer and the third conductive layer 106c is formed (FIG. 1D).

Then, the semiconductor layer 103 is doped with one conductivity-type impurity. The use of the second conductive laminated pattern allows an LDD region, a source region, and a drain region to be formed in s self-alignment manner.

Figure 2A:
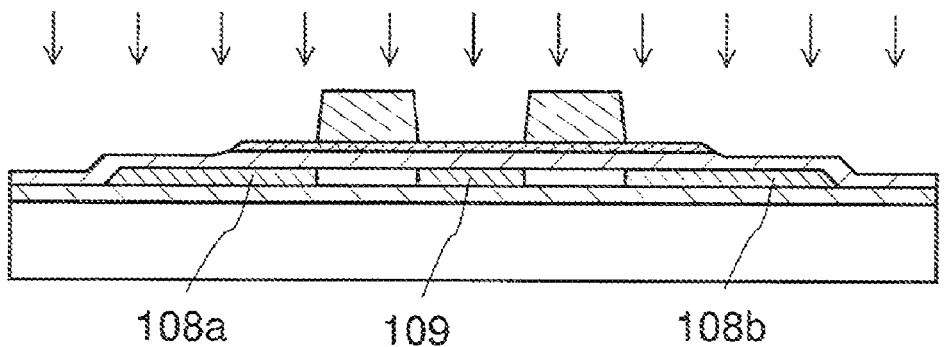
FIGS. 2A to 2C are cross-sectional views showing the process of manufacturing the semiconductor device according to the present invention (Embodiment Mode 1)

FIG. 2A shows a doping process for forming LDD regions overlapped with the gate electrode, the semiconductor layer 103 located below the first conductive layer 105b is doped with ions of one conductivity type impurity through regions of the first conductive layer 105b on which the second conductive layer or the third conductive layer is not laminated to form first-concentration one conductivity-type impurity regions 108a, 108b, and 109. Phosphorous (or As) is used here as the ions of the one conductivity-type impurity to manufacture an n-channel TFT.

Depending on the film thicknesses of the second insulating layer and the first conductive layer, an acceleration voltage of 50 kV or more is required in this case. The impurity concentration in the impurity region for each of the first-concentration one conductivity-type impurity regions 108a, 108b, and 109 is $1\times10^{16}$ to $5\times10^{18}$ atoms/cm$^3$ (the peak value in SIMS measurement) given an LDD region.

It is to be noted that during the doping process described above, parts of the semiconductor layer located to overlap with the second conductive layer or the third conductive layer 106c are regions that are not doped with the ions of the one conductivity-type impurity, and are portions to function as channel forming regions of a TFT to be formed later. In the semiconductor layer, a plurality of, here, two regions that are not doped with the ions of the one conductivity-type impurity are formed. In the specification, the one conductivity-type impurity region sandwiched between the plurality of the regions (channel forming regions), here, the region is referred to as an intermediate impurity region 109.

Figure 2B:
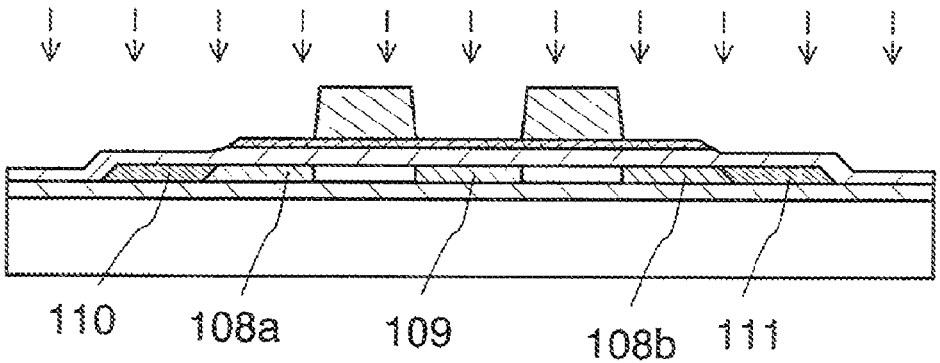

FIG. 2B shows a doping process for forming a source region and a drain region that are positioned outside the gate electrode, where the semiconductor layer 103 is doped with ions of one conductivity-type impurity with the second conductive laminated pattern as a mask to form second-concentration one conductivity-type impurity regions 110 and 111. The doping process for forming the source region and the drain region is carried out at an acceleration voltage of 30 kV or less. The concentration of the second-concentration one conductivity-type impurity region 110 is $1\times10^{19}$ to $5\times10^{21}$ atoms/cm$^3$ (the peak value in SIMS measurement).

It is to be noted that the order of doping steps is not limited to the order described above, and the doping process for forming the LDD region may be carried out after carrying out the doping process for forming the source region and the drain region in first. In addition, although the doping process here is divided into the two steps to form impurity regions with different concentrations, the impurity regions with different concentrations may be formed in one-step doping process by adjusting the process conditions.

Thereafter, a third insulating film 112 using a silicon nitride is formed. Then, activation of the impurity element with which the semiconductor layer is doped and hydrogenation are carried out.

Then, a light-transmitting inorganic material (such as a silicon oxide, a silicon nitride, or a silicon oxynitride) or a low dielectric constant organic compound material (a photosensitive or non-photosensitive organic resin material) is used to form a fourth insulating film 113. Alternatively, a material including a siloxane may be used to form the fourth insulating film. A siloxane is a material that has a skeleton structure formed by bonding silicon (Si) and oxygen (O), where an organic group including at least hydrogen (for example, an alkyl group or an aromatic hydrocarbon) is used as a substituent. A fluoro group may be used as a substituent. Alternatively, an organic group including at least hydrogen and a fluoro group may be used as substituents.

Then, a third photomask is used to form a mask of a resist, and the third insulating film 112 and the fourth insulating film 113 that function as an interlayer insulating film and the second insulating film 104 that functions as a gate insulating film are selectively etched to form contact holes. Then, the mask of the resist is removed.

Then, after forming metal laminated films by sputtering, a fourth photomask is used to form a mask of a resist, and the metal laminated film is selectively etched to form a source electrode 114 and a drain electrode 115 in contact with the semiconductor layer.

It is to be noted that a connecting electrode (an electrode electrically connecting to a plurality of TFTs) and a terminal electrode (an electrode for connecting with an external power source) can also be formed on the fourth insulating film 113 at the same time as the source electrode 114 and the drain electrode 115 of the TFT. Then, the mask of the resist is removed. It is to be noted that the metal laminated films are three laminated layers of a Ti film of 100 nm in film thickness, an Al film of 350 nm in film thickness containing a slight amount of Si, and a Ti film of 100 nm in film thickness. It is preferable that the metal laminated films be formed continuously in the same metal sputtering system.

Figure 2C:
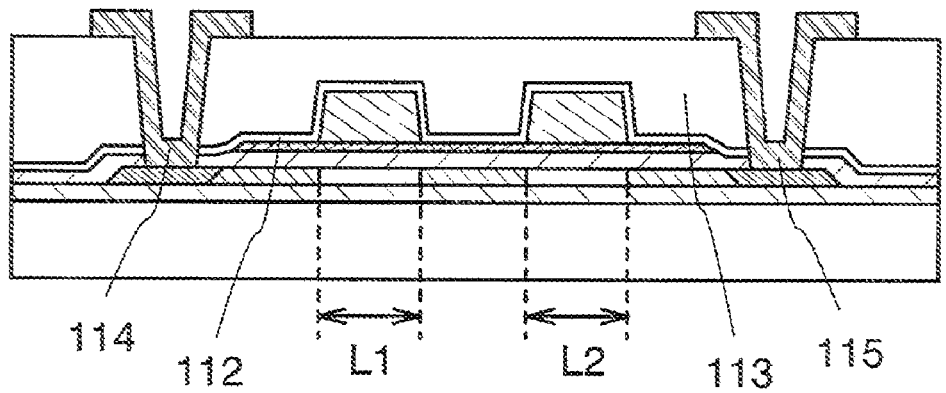

By the processes describe above, a top-gate TFT that has the multi-gate structure shown in FIG. 2C is completed.

As described above, in the present embodiment mode, the mask pattern 107a that has a complicated shape is formed by light exposure using a photomask or a reticle provided with an assist pattern that is composed of a diffraction grating pattern or a semi-transparent film and has a function of reducing a light intensity, and the second conductive laminated pattern is obtained as a gate electrode by etching using the mask pattern 107a. The present invention allows the distance between the two second conductive layers overlapped with the semiconductor layer to be narrowed, and accordingly, the distance between the two channel forming regions can be narrowed. In addition, the width of the intermediate impurity region (the width in the cannel length direction) can be made shorter. Accordingly, the occupied area of the top-gate TFT that has the multi-gate structure can be reduced.

In the double-structure TFT shown in FIG. 2C, for example, the channel length l, the width of the LDD region, and the distance between the second conductive layer and the third conductive layer, that is, the distance between the two channel forming regions can be 2 μm, 0.7 μm, and 0.7 μm, respectively. Accordingly, the gate electrode width of the double-structure TFT, that is, the width of the second conductive laminated pattern (the width in the channel length direction) can be 6.1 μm (0.7 μm+2 μm+0.7 μm+2 μm+0.7 μm).

When normal light exposure is used without using an assist pattern that is composed of a diffraction grating pattern or a semi-transparent film and has a function of reducing a light intensity, it has been difficult to make the distance between two channel forming regions less than 2 μm due to the light exposure limit in the case of manufacturing a TFT that has a double-gate structure.

Additionally, in order to extend the lifetime against hot carrier degradation, the LDD region overlapping with the gate electrode of the TFT can be formed.

In addition, the LDD region can be formed in a self-alignment manner with the second conductive laminated pattern as a mask.

In addition, a top-gate TFT that has the multi-gate structure described above and a top gate TFT that has a single-gate structure can be formed on the same substrate just by changing the mask without increasing the number of processes. Accordingly, various circuits can be made up by applying transistors that have the most appropriate structures.

The present embodiment mode is described with reference to an n-channel TFT. However, it is obvious that a p-type impurity element can be substituted for an n-type impurity element to form a p-channel TFT.

In addition, an n-channel TFT and a p-channel TFT are formed on the same substrate, and complementary combination of these TFTs allows a CMOS circuit to be made up. A CMOS circuit refers to a circuit that includes at least one n-channel TFT and one p-channel TFT (such as an inverter circuit, a NAND circuit, an AND circuit, a NOR circuit, an OR circuit, a shift register circuit, a sampling circuit, a D/A converter circuit, an A/D converter circuit, a latch circuit, and a buffer circuit). Additionally, memory elements such as an SRAM and a DRAM and other elements can be made up on a substrate by combining these CMOS circuits. In addition, various elements and circuits can be integrated to form a CPU on a substrate.

Embodiment Mode 2

In the present embodiment mode, an example where TFTs that have different structures are manufactured on the same substrate by using the patterning method of Embodiment Mode 1 will be described with reference to FIG. 3.

Figure 3:
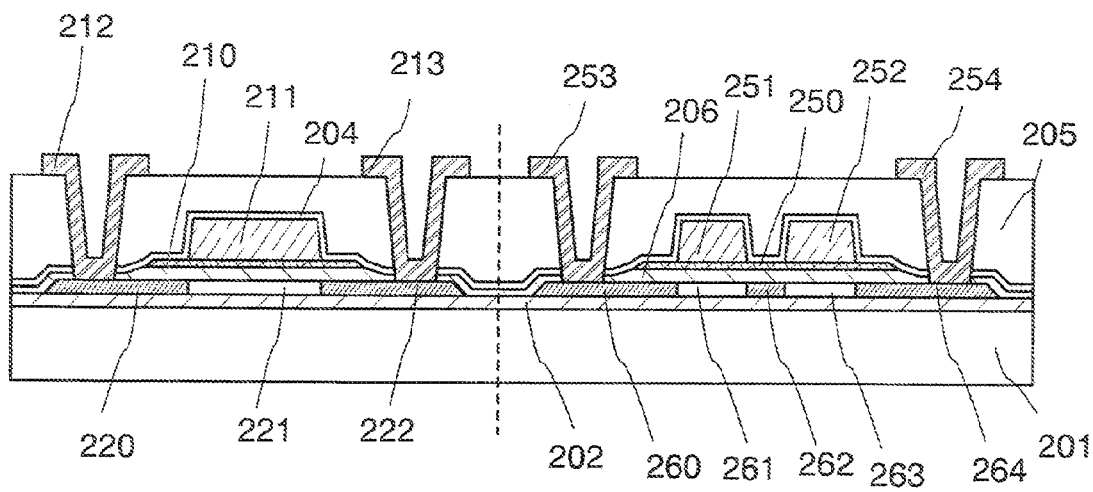
FIG. 3 is a cross-sectional view showing a semiconductor device according to the present invention (Embodiment Mode 2)

FIG. 3 shows an example where an n-channel TFT that has a single-gate structure and an n-channel TFT that has a double-gate structure are formed on a substrate 201 and a first insulating film (base insulating film) 202. In FIG. 3, the n-channel TFT that has the single-gate structure has a first conductive layer 210 and a second conductive layer 211 as a gate electrode, and a semiconductor layer that has an impurity region 220, an impurity region 222, and a channel forming region 221. The impurity region 220 and the impurity region 222 are doped with an impurity element that gives an n-type conductivity, to which a source electrode 212 and a drain electrode 213 are connected. The gate electrode of the n-channel TFT that has the single-gate structure is a single gate, the widths of the first conductive layer 210 and the second conductive layer 211 are larger than those of the gate electrode of the n-channel TFT that has the double-gate structure, and the channel length thereof is thus longer.

In addition, in FIG. 3, the n-channel TFT that has the double-gate structure has a first conductive layer 250, a second conductive layer 251, and a third conductive layer 252 as a gate electrode, and a semiconductor layer that has an impurity region 260, an intermediate impurity region 262, an impurity region 264, a channel forming region 261, and a channel forming region 263. The impurity region 260, the intermediate impurity region 262, and the impurity region 264 are doped with an impurity element that gives an n-type conductivity, and the impurity region 260 and the impurity region 264 are connected to a source electrode 253 and a drain electrode 254. The gate electrode of the n-channel TFT that has the double-gate structure has a structure in which the second conductive layer 251 and the third conductive layer 252 are provided adjacently on the first conductive layer 250. In addition, in FIG. 3, a second insulating film (gate insulating film) 206 is provided to cover the semiconductor layers, and a third insulating film 204 and a fourth insulating film 205 are provided to cover the gate electrode layers. Please note that a portion in the impurity region 220 covered by the first conductive layer 210 is a low concentration impurity region and functions as an LDD region. Similarly, a portion in the impurity region 222 covered by the first conductive layer 210 is a low concentration impurity region. Portions in the impurity regions 260 and 264 covered by the first conductive layer 250 are low concentration impurity regions. Also, the intermediate impurity region 262 is a low concentration impurity region.

The present embodiment mode can be freely combined with Embodiment Mode 1.

Embodiment Mode 3

In the present embodiment mode, an example where TFTs that have different structures are manufactured on the same substrate by using the patterning method of Embodiment Mode 1 will be described with reference to FIG. 4.

Figure 4:
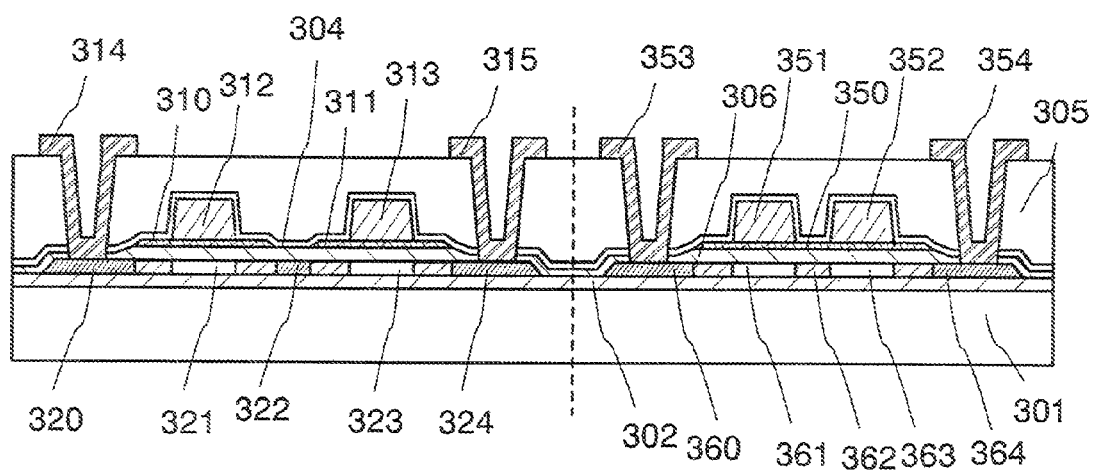
FIG. 4 is a cross-sectional view showing a semiconductor device according to the present invention (Embodiment Mode 3)

FIG. 4 shows an example where two kinds of n-channel TFTs that have double-gate structures are formed on a substrate 301 and a first insulating film (base insulating film) 302. In FIG. 4, the n-channel TFT that has a first double-gate structure has a first conductive layer 310, a first conductive layer 311, a second conductive layer 312, and a third conductive layer 313 as a gate electrode, and a semiconductor layer that has an impurity region 320, an intermediate impurity region 322 which includes different concentration impurity regions, an impurity region 324, a channel forming region 321, and a channel forming region 323. The impurity region 320, the intermediate impurity region 322, and the impurity region 324 are doped with an impurity element that gives a n-type conductivity, and a source electrode 314 and a drain electrode 315 are connected to the impurity region 320 and the impurity region 324. The gate electrode of the n-channel TFT that has the first double-gate structure has a structure in which the second conductive layer 312 and the third conductive layer 313 are laminated to be provided on the first conductive layer 310 and the first conductive layer 311, respectively.

In addition, in FIG. 4, the n-channel TFT that has a second double-gate structure has a first conductive layer 350, a second conductive layer 351, and a third conductive layer 352 as a gate electrode, and a semiconductor layer that has an impurity region 360, an intermediate impurity region 362, an impurity region 364, a channel forming region 361, and a channel forming region 363. The impurity region 360, the intermediate impurity region 362, and the impurity region 364 are doped with an impurity element that gives a n-type conductivity, and a source electrode 353 and a drain electrode 354 are connected to the impurity region 360 and the impurity region 364. The gate electrode of the n-channel TFT that has the second double-gate structure has a structure in which the second conductive layer 351 and the second conductive layer 352 are provided adjacently on the first conductive layer 350. In addition, in FIG. 4, a second insulating film (gate insulating film) 306 is provided to cover the semiconductor layers, and a third insulating film 304 and a fourth insulating film 305 are provided to cover the gate electrode layers. A portion between the channel forming region 321 and the impurity region 320 is a low concentration impurity region covered by the first conductive layer 310 and functions as an LDD region. Regions besides both sides of the intermediate impurity region 322 are low concentration impurity regions covered by the first conductive layer 310. A region between the channel forming region 323 and the impurity region 324 is a low concentration impurity region covered by the first conductive layer 311. A region between the channel forming region 361 and the impurity region 360 is a low concentration impurity region covered by the first conductive layer 350. A region between the channel forming region 363 and the impurity region 364 is a low concentration impurity region covered by the first conductive layer 350. Also, intermediate impurity region 362 is a low concentration impurity region. These two type TFTs having different structures can be manufactured by using different mask patterns used for making gate electrodes.

The present embodiment mode can be freely combined with Embodiment Mode 1 or 2.

Embodiment Mode 4

In the present embodiment mode, a light exposure mask provided with an assist pattern that is composed of a diffraction grating pattern or a semi-transparent film and has a function of reducing a light intensity will be described with reference to FIGS. 5A to 5D.

Figure 5A:
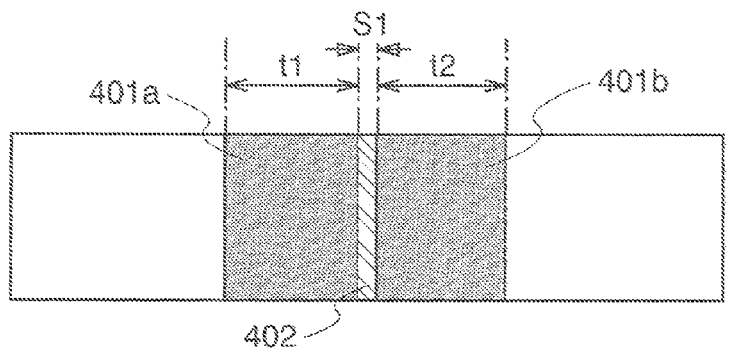
FIGS. 5A to 5D are diagrams showing top views and a cross-sectional view of masks for light exposure (Embodiment Mode 4)
Figure 5B:
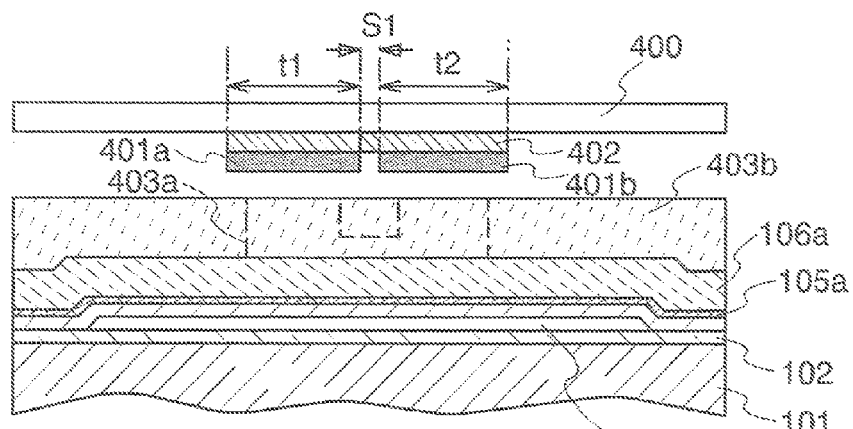

FIG. 5A is an enlarged top view of a portion of a light exposure mask. In addition, FIG. 5B shows a cross-sectional view of the portion of the light exposure mask corresponding to FIG. 5A. In FIG. 5B, the light exposure mask and a corresponding substrate over which a resist is formed by overall coating are shown.

The same parts in FIG. 5B as those in FIG. 1A will be described with reference to the same reference numerals.

In FIG. 5A, the light exposure mask is provided with light-shielding portions 401a and 401b composed of a metal film such as Cr and, as an assist pattern, a portion 402 provided with only a semi-transparent film. The width of the light-shielding portion 401a is denoted by t1, the width of the light-shielding portion 401b is denoted by t2, and the width of the portion 402 provided with the semi-transparent film is denoted by S1. The distance between the light-shielding portion 401a and the light-shielding portion 401b can also be said to be S1.

In the top of FIG. 5B, the light exposure mask has the semi-transparent film 402 of MoSiN on a light-transmitting base 400, and has the light-shielding portions 401a and 401b composed of a metal film such as Cr to be laminated on the semi-transparent film 402.

When the light exposure mask shown in FIGS. 5A and 5B is used to light-exposure the resist film, a non-light-exposed region 403a and a light-exposed region 403b are formed as shown in the bottom of FIG. 5B. The exposed region 403b shown in the bottom of FIG. 5B is formed by the light wrap-around, the light transmitted through the semi-transparent film during light exposure and so on.

Then, when development is carried out, the exposed region 403b is removed and the non-light-exposed region 403a remains. The resist pattern 107a shown in FIG. 1A may be formed by a heating step, if necessary.

Figure 5C:
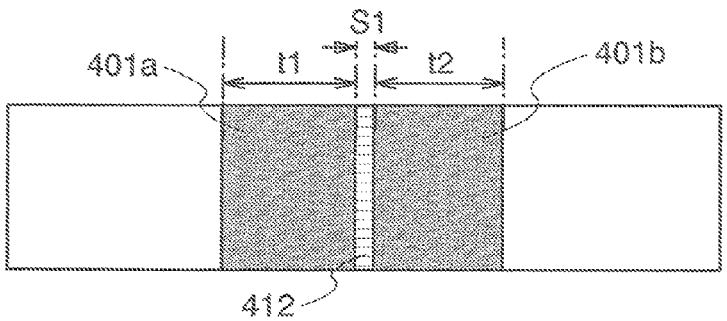

In addition, as an example of other light exposure masks, FIG. 5C shows a top view of a light exposure mask provided with a diffraction grating pattern 412 with a plurality of slits between a light-shielding portion 401a and a light-shielding portion 401b. The use of the light exposure mask shown in FIG. 5C also allows the non-light-exposed region 403a to remain. Then, the resist pattern 107a shown in FIG. 1A to be obtained by a heating step.

Figure 5D:
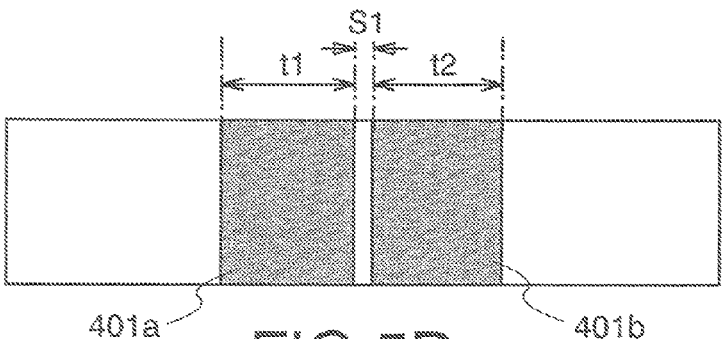

In addition, as an example of other light exposure masks, FIG. 5D shows a top view of a light exposure mask provided with a distance of the light exposure limit or less between a light-shielding portion 401a and a light-shielding portion 401b. For example, a TFT that has a double-gate structure in which the distance between two channel forming regions is less than 2 μm can be manufactured in accordance with the manufacturing process in Embodiment Mode 1 after using a light exposure mask with t1 of 6 μm, t2 of 6 μm, and S1 of 1 μm to carry out light exposure under optimal light exposure conditions. The use of the light exposure mask shown in FIG. 5D also allows the non-light-exposed region 403a to remain. Then, the resist pattern 107a shown in FIG. 1A to be obtained by a heating step.

The present embodiment mode can be freely combined with Embodiment Mode 1, 2, or 3.

Embodiment Mode 5

In the present embodiment mode, an example of manufacturing a TFT that has a multi-gate structure with three cannel forming regions will be described with reference to FIGS. 6A and 6B and FIGS. 7A and 7B.

Figure 6A:
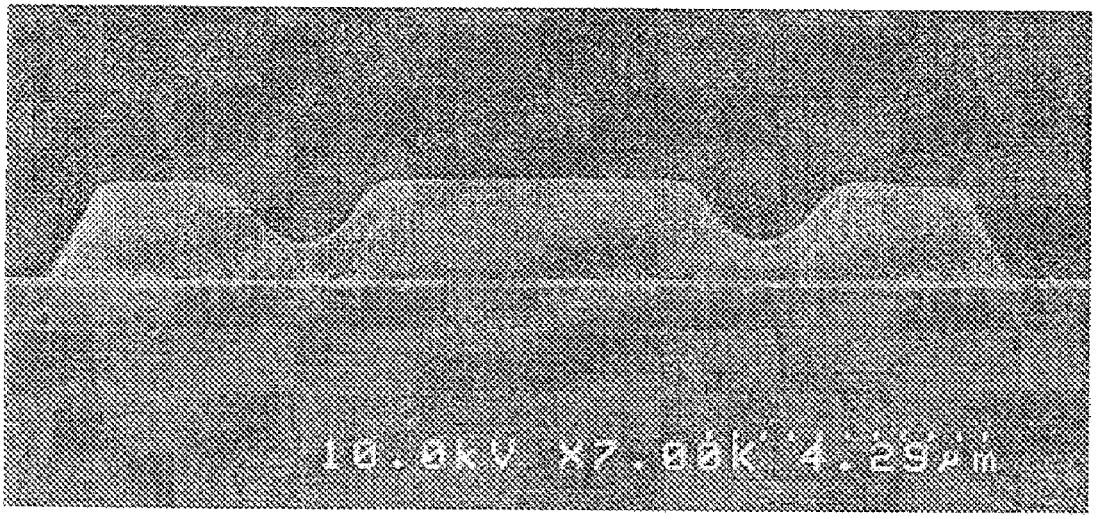
FIGS. 6A and 6B are photographs of cross-sectional views of resist pattern s formed on glass substrates (Embodiment Mode 5)

The light exposure mask shown in Embodiment Mode 4 is applied to form a resist pattern with three portions that are thicker in film thickness as compared with the other portions, and a photograph of a cross section thereof is shown in FIG. 6A. Further, heating at 200° C. is performed in order to smooth the surface. A photograph of a cross section after this heating is shown in FIG. 6B.

Figure 6B:
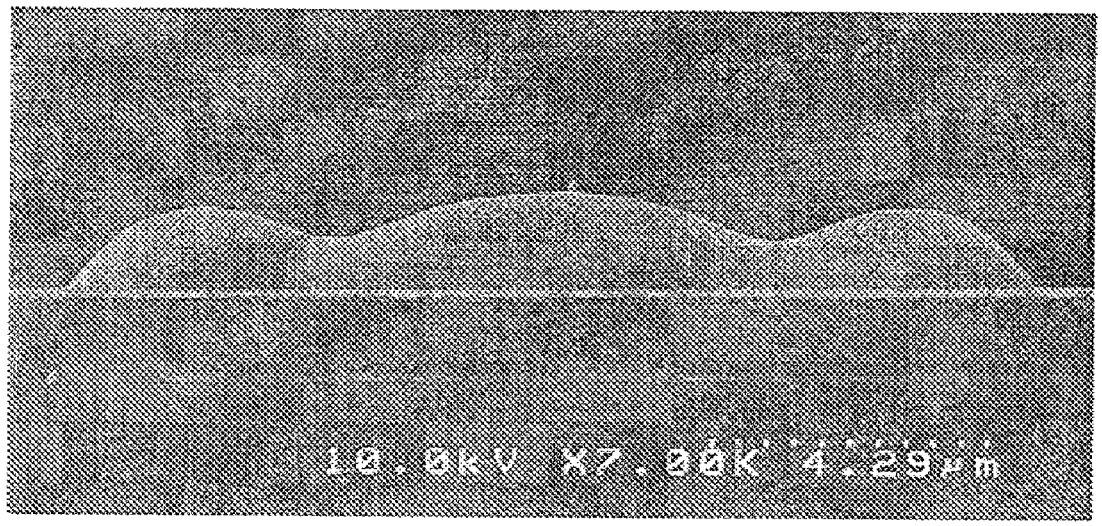

Patterning of the laminated layers of the first conductive layer and the second conductive layer that are shown in Embodiment Mode 1 may be carried out with the use of the resist pattern shown in FIG. 6A or 6B to form a gate electrode of a TFT that has a multi-gate structure with three channel forming regions.

Figure 7A:
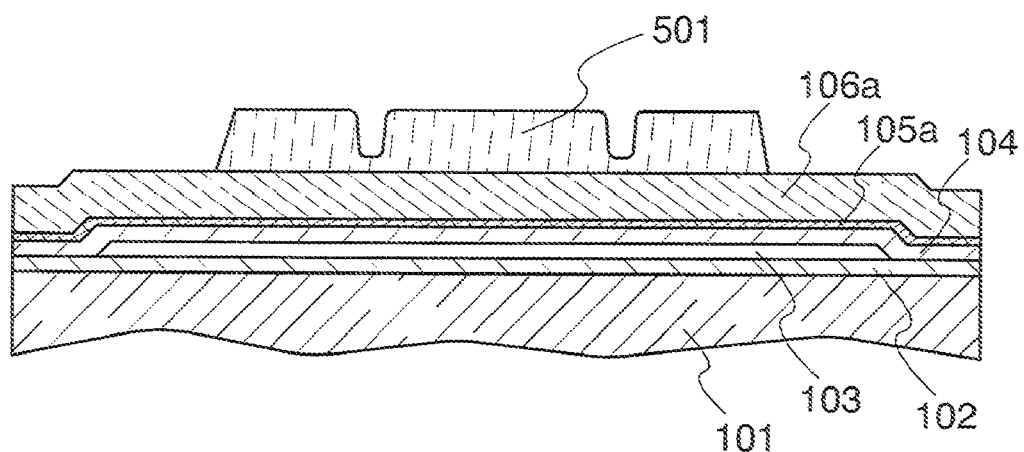
FIGS. 7A and 7B are cross-sectional views showing a manufacturing process of a semiconductor device (Embodiment Mode 5)

FIG. 7A shows a cross-sectional view of a process, which corresponds to FIG. 6A. It is to be noted that the same portions in FIG. 7A as those in FIG. 6A will be described with the use of the same reference numerals.

In FIG. 7A, a first insulating film (a base insulating film) 102, a semiconductor layer 103, and a second insulating film (a gate insulating film) 104 are formed over a substrate 101, and a first conductive layer 105a and a second conductive layer 106a are formed thereon. The mask pattern 501 is formed by a light exposure process using a photoresist. The mask pattern 501 has three portions that are thicker in film thickness as compared with the other portions, and the length of the middle portion is longer than the other portions. Accordingly, the second conductive layer that is etched with the use of this mask pattern serves for a TFT that has a multi-gate structure including three channel forming regions that are different in width and accordingly different in channel length.

It is to be noted that the mask pattern 501 can be made to have the shape shown in FIG. 7A by using a photomask or a reticle provided with an assist pattern that is composed of a diffraction grating pattern or a semi-transparent film and has a function of reducing a light intensity. The mask pattern can be made to smooth the surface as shown in the FIG. 6B by a heating step, if necessary.

Figure 7B:
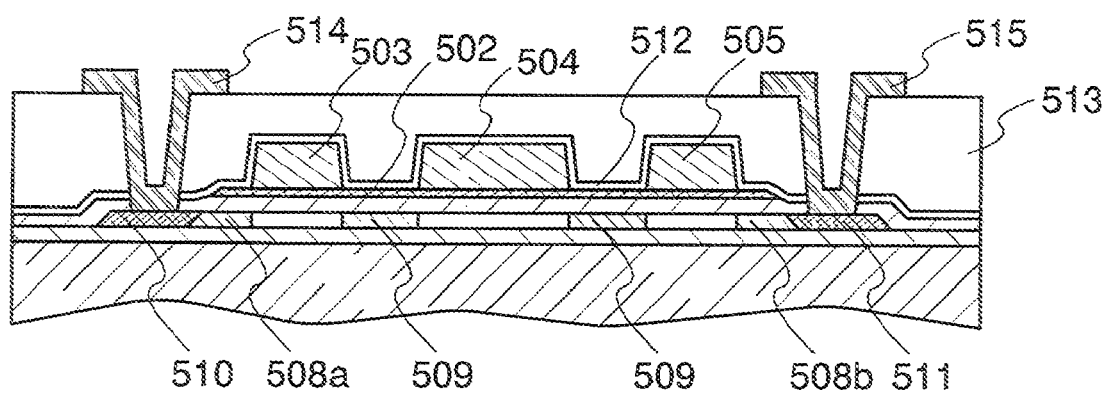

When subsequent processes are carried out as in Embodiment Mode 1, a TFT that has a multi-gate structure with three channel forming regions, which is shown in FIG. 7B, is completed.

In FIG. 7B, the TFT that has the multi-gate structure has a first conductive layer 502 and second conductive layer 503, the third conductive layer 504, and the fourth conductive layer 505 as a gate electrode. In addition, the semiconductor layer has intermediate impurity regions 509 in two positions, and has first-concentration one conductivity-type impurity regions 508a and 508b and second-concentration one conductivity-type impurity regions 510 and 511. In addition, in FIG. 7B, a third insulating film 512 and a fourth insulating film 513 are provided to cover the semiconductor layer. In addition, the TFT that has the multi-gate structure has a source electrode 514 and a drain electrode 515.

Aa TFT that has the structure in FIG. 7B and a TFT that has the structure in FIG. 2C and so on can be formed on the same substrate just by changing the light exposure mask without increasing the number of processes.

The present embodiment Mode can be freely combined with Embodiment 1, 2, 3, or 4.

Embodiment Mode 6

In the present embodiment mode, the structure of an active matrix light-emitting device will be described below along with a manufacturing method thereof with reference to FIGS. 8, 9, 10, 11, and 12A and 12B.

First, a base insulating film is formed on a substrate 610. In the case of extracting luminescence for the substrate 610 side as a display surface, a light-transmitting glass substrate or quartz substrate may be used as the substrate 610. In addition, a light-transmitting plastic substrate that has heat resistance for withstanding processing temperatures may be used. Alternatively, in the case of extracting luminescence with a side opposite to the substrate 610 side as a display surface, a silicon substrate, a metal substrate, or a stainless-steel substrate with an insulating film formed on the surface thereof may be used besides the substrates described above. A glass substrate is used here as the substrate 610. It is to be noted that the refractive index of the glass substrate is about 1.55.

As the base insulating film 611, a base film composed of an insulating film such as a silicon oxide film, a silicon nitride film, or silicon oxynitride film is formed. An example of using a single-layered structure as the base film is shown here. However, a laminated structure of two or more of the insulating films described above may be used. It is to be noted that it is not particularly necessary to form the base insulating film when asperity of the substrate or impurity diffusion from the substrate has no problem.

Then, semiconductor layers are formed on the base insulating film 611. The semiconductor layers are formed in such a way that patterning of a crystalline semiconductor film obtained by carrying out a known crystallization process (such as laser crystallization, thermal crystallization, or thermal crystallization using a catalyst such as nickel) after forming a semiconductor film that has an amorphous structure by a known means (such as sputtering, LPCVD, or plasma CVD), is carried out into a desired shape with the use of a first photomask. It is to be noted that when plasma CVD is used, the base insulating film and the semiconductor film that had the amorphous structure can be formed continuously without being exposed to the air. This semiconductor layer is formed to have a thickness of 25 to 80 nm (preferably 30 to 70 nm). The material for the crystalline semiconductor film is not limited. However, the crystalline semiconductor film is preferably formed by using silicon, a silicon-germanium (SiGe) alloy, or the like.

Then, the resist mask is removed. Then, if necessary, doping with a slight mount of impurity element (boron or phosphorous) is carried out to the semiconductor layers to control the threshold voltage of a TFT. Ion doping with plasma excitation diborane ($B_2H_6$) without mass separation is used here.

Then, an oxide film on the surface of the semiconductor layer is removed with an etchant containing hydrofluoric acid and at the same time, the surface of the semiconductor layer is cleaned with the etchant.

Then, an insulating film covering the semiconductor layers is formed. The insulating film is formed by plasma CVD or sputtering to have a thickness of 1 to 200 nm. Preferably, the gate insulating layer is formed to be 10 to 50 nm thin by using a single layer or laminated structure that has an insulating film including silicon, and a surface nitridation treatment using microwave plasma is then carried out. The insulating film functions as a gate insulating film for a TFT to be formed later.

Then, a first conductive film with a film thickness of 20 to 100 nm and a second conductive film with a film thickness of 100 to 400 nm are laminated on the insulating film. In the present embodiment mode, a tantalum nitride film of 50 nm in film thickness and a tungsten film of 370 nm in film thickness are sequentially laminated on the insulating film 613, and the patterning described in Embodiment Mode 1 is carried out to form respective electrodes and respective wirings. In the present embodiment mode, a photomask or a reticle provided with an assist pattern that is composed of a diffraction grating pattern or a semi-transparent film and has a function of reducing a light intensity is used to form the respective electrodes and the respective wirings.

It is to be noted that the conductive films are laminated layers of the TaN film and the W film here, but not particularly limited, and may be formed by laminating films each comprising at least one of selected from Ta, W, Ti, Mo, Al, and Cu, or an alloy material or compound material including the element as its main component. Alternatively, a semiconductor film typified by a polycrystalline silicon film doped with an impurity element such as phosphorous may be used. In addition, the structure is not limited to the two-layer structure, and, for example, may be a three-layer structure formed by sequentially laminating a tungsten film of 50 nm in film thickness, an aluminum-silicon (Al—Si) alloy film of 500 nm in film thickness, and a titanium nitride film of 30 nm in film thickness.

It is preferable to use ICP (Inductively Coupled Plasma) etching for etching of the first conductive film and the second conductive film (a first etching process and a second etching process). The films can be etched into a desired taper shape by using ICP etching and appropriately adjusting etching conditions (the electric energy that is applied to a coiled electrode, the electric energy that is applied to an electrode on the substrate side, the temperature of the electrode on the substrate side, and the like).

Then, for doping the semiconductor layers with an impurity element that gives an n-type conductivity, a first doping process of overall doping with the gate electrodes as masks is carried out. The first doping process may be carried our by ion doping or ion implantation. The ion doping is carried out under the condition that the dose is $1.5 \times 10^{13}$ atoms/cm$^2$ and the acceleration voltage is 50 to 100 kV. As the impurity element that gives an n-type conductivity, phosphorous (P) or arsenic (As) is typically used.

Then, after forming a mask of a resist, a second doping process is carried out for doping the semiconductor with a high concentration of impurity element that gives an n-type conductivity. The masks are provided in order not to dope for a channel forming region of the semiconductor layer for forming a p-channel TFT in a pixel portion and a peripheral portion thereof, a channel forming region of the semiconductor layer for forming a p-channel TFT in a driver circuit portion and a peripheral portion thereof, and so on.

Ion doping in the second doping process is carried out under the condition that the dose amount is $1\times10^{13}$ to $5\times10^{15}/$ cm$^2$ and the acceleration voltage is 60 to 100 keV.

Then, after removing the mask, a mask of a resist is newly formed, and a third doping process is carried out for doping the semiconductor with a high concentration of impurity element (typically, boron) that gives a p-type conductivity. The masks are provided in order not to dope for a channel forming region of the semiconductor layer for forming the n-channel TFT in the pixel portion and a peripheral portion thereof, a channel forming region of the semiconductor layer for forming an n-channel TFT in the driver circuit portion and a peripheral portion thereof, and so on.

Thereafter, the resist mask is removed. By the processes described above, impurity regions that have the n-type or p-type conductivity type are formed in the respective semiconductor layers.

Then, after forming an insulating film containing hydrogen by sputtering, LPCVD, plasma CVD, or the like, activation of the impurity elements with which the semiconductor layers are doped and hydrogenation are carried out. For the insulating film containing hydrogen, a silicon nitride oxide film (SiNO film) that is obtained by PCVD is used. The film thickness of the insulating film containing hydrogen here is made to be 50 to 200 nm. Additionally, in the case of using a metal element that promotes crystallization, typically nickel, to crystallize the semiconductor film, gettering of reducing the metal element in the channel forming regions can be carried out at the same time as the activation. It is to be noted that the insulating film containing hydrogen is a first layer of an interlayer insulating film and includes a silicon oxide.

Then, an inorganic insulating film that serves as a second layer for the interlayer insulating film is formed by sputtering, LPCVD, plasma CVD, or the like. As the inorganic insulating film, a single layer of an insulating film such as a silicon oxide film, a silicon nitride film, and a silicon oxynitride film is used, or laminated layers of the insulating films are used. The film thickness of the inorganic insulating film here is made to be 600 to 800 nm.

Then, a mask of a resist is formed by using a photomask, and the insulating films are selectively etched to form contact holes. Then, the mask of the resist is removed.

Then, after laminating metal films by sputtering, a mask of a resist is formed by using a photomask, and the metal laminated films are selectively etched to form electrodes that functions as a source electrode or a drain electrode of a TFT. It is to be noted that the metal laminated films are formed continuously in the same metal sputtering system. Then, the mask of the resist is removed.

In accordance with the processes described above, top gate TFTs 636, 637, 638, and 639 that have polysilicon films as active layers can be manufactured over the same substrate.

It is to be noted that the TFT 638 that is placed in a pixel portion is an n-channel TFT that has a plurality of channel forming regions in a TFT. The TFT 638 is a double-gate TFT. In addition, the TFT 639 that is electrically connected to a light-emitting element to be formed later is provided in the pixel portion. A double-gate p-channel TFT is shown here as the TFT 639 for reducing off current. However, the TFT 639 is not particularly limited, and may be a single-gate TFT.

In addition, the TFT 636 that is placed in a driver circuit portion is an n-channel TFT with a lower concentration impurity region (also referred to as an LDD region) overlapping with the gate electrode, and the TFT 637 is a p-channel TFT. The TFTs 636 and 637 are both TFTs that have single-gate structures. In the driver circuit portion, complementary connection between the TFT 636 and the TFT 637 allows a CMOS circuit to be made up, and allows various kinds of circuits to be achieved. Alternatively, the TFTs 636 and 637 may be multi-gate TFTs if necessary.

Then, a first electrode 623, that is, an anode (or a cathode) of an organic light-emitting element is formed. As the first electrode 623, a material that has a large work function, for example, an element selected from Ni, W, Cr, Pt, Zn, Sn, In, and Mo, or an alloy material including the metal element as its main component, for example, TiN, TiSi$_x$N$_y$, WSi$_x$, WN$_x$, WSi$_x$N$_y$, or NbN, may be used to form a single layer film or a film of laminated layers with the total film thickness in the range of 100 to 800 nm.

Specifically, as the first electrode 623, a transparent conductive film composed of a light-transmitting conductive material may be used, and an indium oxide containing a tungsten oxide, an indium zinc oxide containing a tungsten oxide, an indium oxide containing a titanium oxide, an indium tin oxide containing a titanium oxide, and the like can be used. Of course, an indium tin oxide (ITO), an indium zinc oxide (IZO), and an indium tin oxide doped with a silicon oxide (ITSO), and the like can be also used.

In addition, examples of the composition ratios of the respective light-transmitting conductive materials are described. The composition ratio of the indium oxide containing the tungsten oxide may be 1.0 wt % of tungsten oxide and 99.0 wt % of indium oxide. The composition ratio of the indium zinc oxide containing the tungsten oxide may be 1.0 wt % of tungsten oxide, 0.5 wt % of zinc oxide, and 98.5 wt % of indium oxide. The composition ratio of the indium oxide containing the titanium oxide may be 1.0 to 5.0 wt % of titanium oxide and 99.0 to 95.0 wt % of indium oxide. The composition ratio of the indium tin oxide (ITO) may be 10.0 wt % of tin oxide and 90.0 wt % of indium oxide. The composition ratio of the indium zinc oxide (IZO) may be 10.7 wt % of zinc oxide and 89.3 wt % of indium oxide. The composition ratio of the indium tin oxide containing the titanium oxide may be 5.0 wt % of titanium oxide, 10.0 wt % of tin oxide, and 85.0 wt % of indium oxide. The composition ratios described above are examples, and the percentages of the composition ratios may be appropriately set.

Then, patterning of an insulating film (for example, an organic resin film) that is obtained by coating is carried out to form an insulator 629 (referred to as a bank, partition, barrier, or embankment) covering an end of the first electrode 623.

Then, a layer 624 including an organic compound is formed by evaporation or coating.

The layer 624 including the organic compound has laminated layers, and a buffer layer may be used as one layer of the layer 624 including the organic compound. The buffer layer is a composite material layer including an organic compound and an inorganic compound, and the inorganic compound exhibits an electron accepting property to the organic compound. The buffer layer is a composite material layer including an organic compound and an inorganic compound, and the inorganic compound has any one or more selected from the group consisting of a titanium oxide, a zirconium oxide, a hafnium oxide, a vanadium oxide, a niobium oxide, a tantalum oxide, a chromium oxide, a molybdenum oxide, a tungsten oxide, a manganese oxide, and a rhenium oxide. The buffer layer is a composite material layer including a hole transporting organic compound and an inorganic compound.

For example, it is preferable to provide laminated layers including an organic compound (laminated layers of the buffer layer and an organic compound layer) between the first electrode 623 and a second electrode. The buffer layer is a composite layer including a metal oxide (such as a molybdenum oxide, a tungsten oxide, or rhenium oxide) and an organic compound (a hole transporting material, for example, 4,4'-bis [N-(3-methylphenyl)-N-phenylamino]-biphenyl (abbreviation; TPD), 4,4'-bis[N-(1-naphthyl)-N-phenylamino]-biphenyl (abbreviation: □-NPD), 4,4'-bis{N-[4-(N,N-di-m-tolylamino)phenyl]-N-phenylamino}biphenyl (abbreviation: DNTPD), or the like). In addition, for a light emitting layer, for example, tris(8-quinolinolato)aluminum (abbreviation: $Alq_3$), tris(4-methyl-8-quinolinolato)aluminum (abbreviation: $Almq_3$), □-NPD, and the like can be used. In addition, the light emitting layer may include a dopant material, and for example, N, N'-dimethylquinacridone (abbreviation: DMQd), coumarin 6, rubrene, and the like can be used. The laminated layers provided between the first electrode and the second electrode may be formed by evaporation such as resistance heating.

By adjusting the film thickness of the buffer layer, the distance between the first electrode and the organic compound layer can be controlled to improve the luminous efficiency. By adjusting the film thickness of the buffer layer, a light-emitting device that is capable of displaying excellent images with the luminescent color from each light-emitting element clear can be achieved with lower power consumption.

Then, a second electrode 625, that is, a cathode (or an anode) of the organic light-emitting element is formed. As the second electrode 625, an alloy such as MgAg, MgIn, or AlLi, or a transparent conductive film (such as an ITO) is used.

Then, a protective layer 626 is formed by evaporation or sputtering. The protective layer 626 protects the second electrode 625. When luminescence from the light-emitting element is transmitted through the protective layer 626 and extracted, it is preferable that the protective layer 626 is a transparent material. It is to be noted that it is not necessary to provide the protective layer 626 if unnecessary.

Then, a sealing substrate 633 is attached with a sealing material 628 to carry out sealing for the light-emitting element, namely, in the light-emitting display device, the periphery of a display region is surrounded by the sealing material to carry out sealing with the pair of substrates. Since the interlayer insulating film for the TFTs is provided over the entire surface of the substrate, there is fear that moisture and impurities enter from a portion of the interlayer insulating film located outside the pattern of the sealing material when the pattern of the sealing material is drawn inside a peripheral edge of the interlayer insulating film. Accordingly, the periphery of the insulating film that is used as the interlayer insulating film for the TFTs is made inside the pattern of the sealing material, preferably overlapped with the pattern of the sealing material to cover ends of the insulating film with the sealing material. It is to be noted that the region surrounded by the sealing material 628 is filled with a filling material 627. Alternatively, the region surrounded by the sealing material 628 is filled with a dried inert gas.

Finally, an FPC 632 is attached to a terminal electrode by a known method with an anisotropic conductive film 631. It is to be noted that it is preferable that a transparent conductive film that is obtained in the same process as that for the first electrode 623 being used for the top layer of the terminal electrode, and the terminal electrode is an electrode that has a structure in which the transparent conductive film is formed on the conductive layer formed at the same time as the gate wiring.

Figure 8:
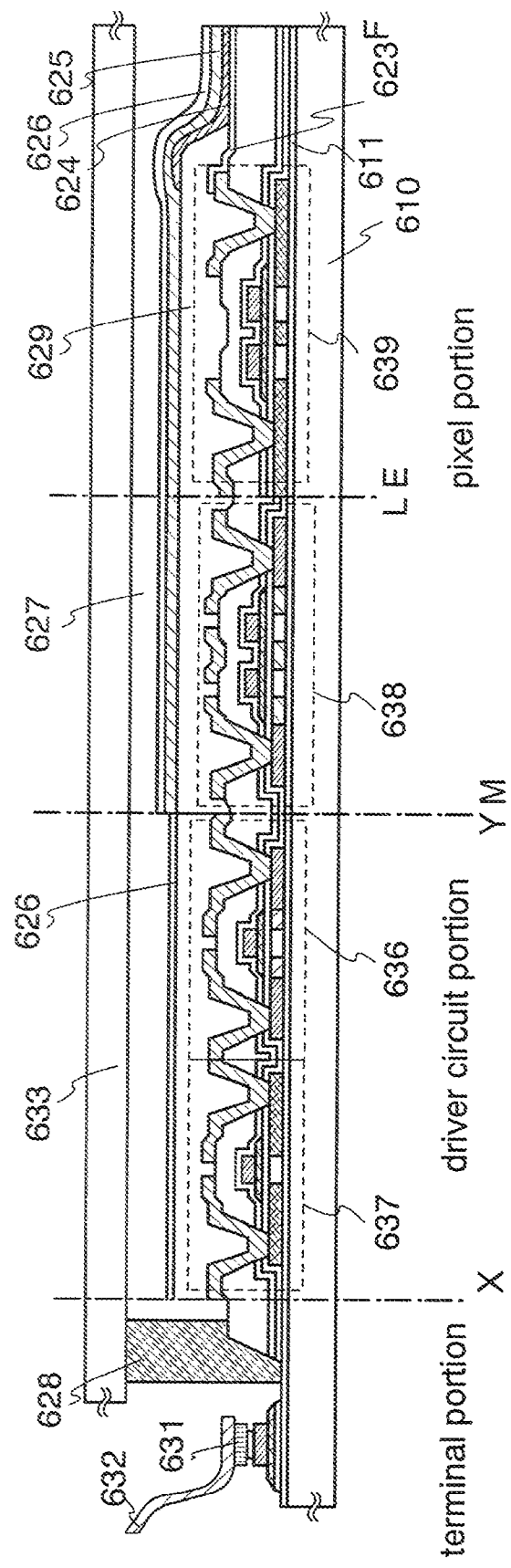
FIG. 8 is a cross sectional view showing the structure of an active matrix EL display device (Embodiment Mode 6)
Figure 9:
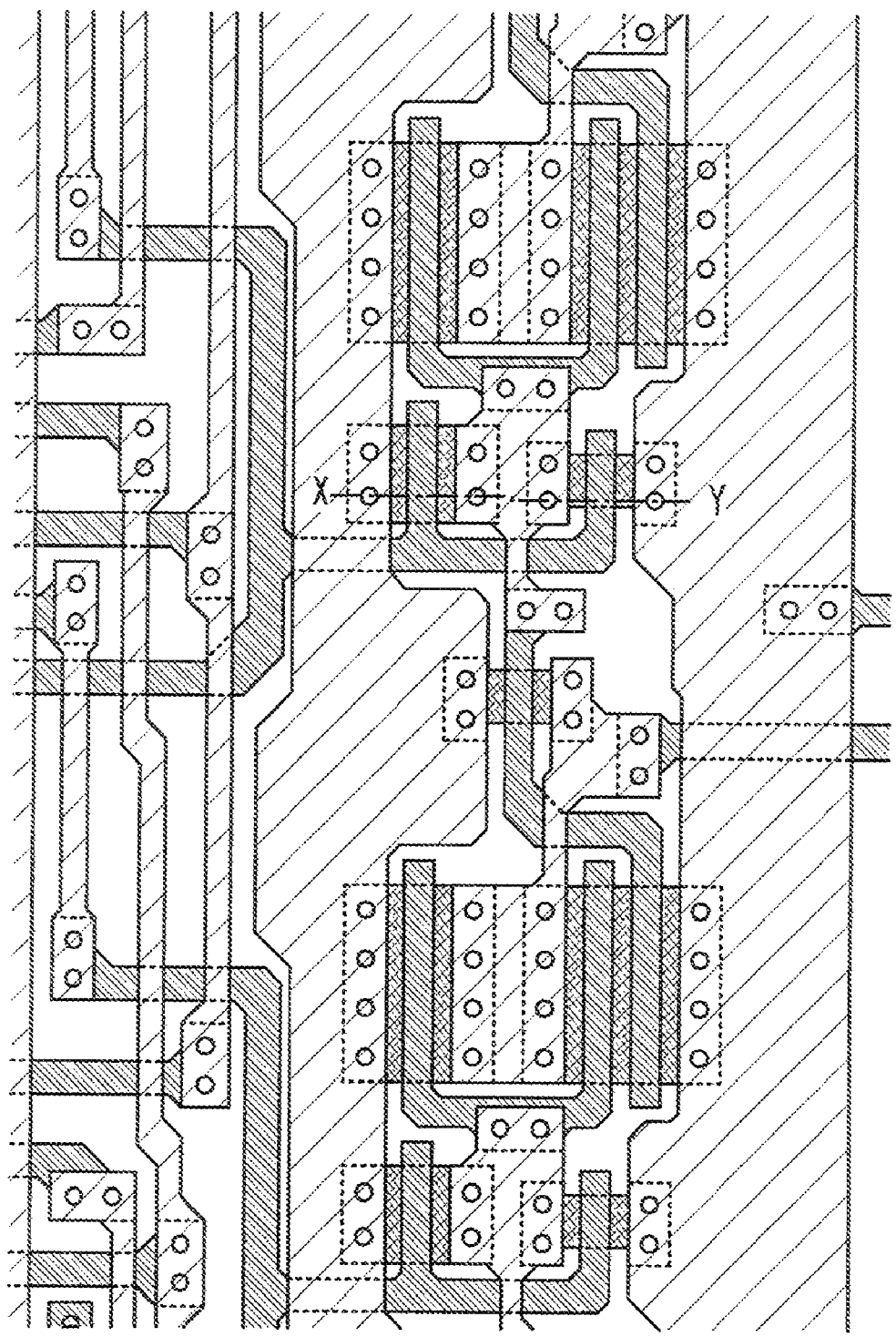
FIG. 9 is a top view showing a portion of a driver circuit of the active matrix EL display device (Embodiment Mode 6)

In addition, FIG. 9 is a top view of a driver circuit, and the cross section along the chained line X-Y in FIG. 9 corresponds to the driver circuit portion in FIG. 8.

Figure 11:
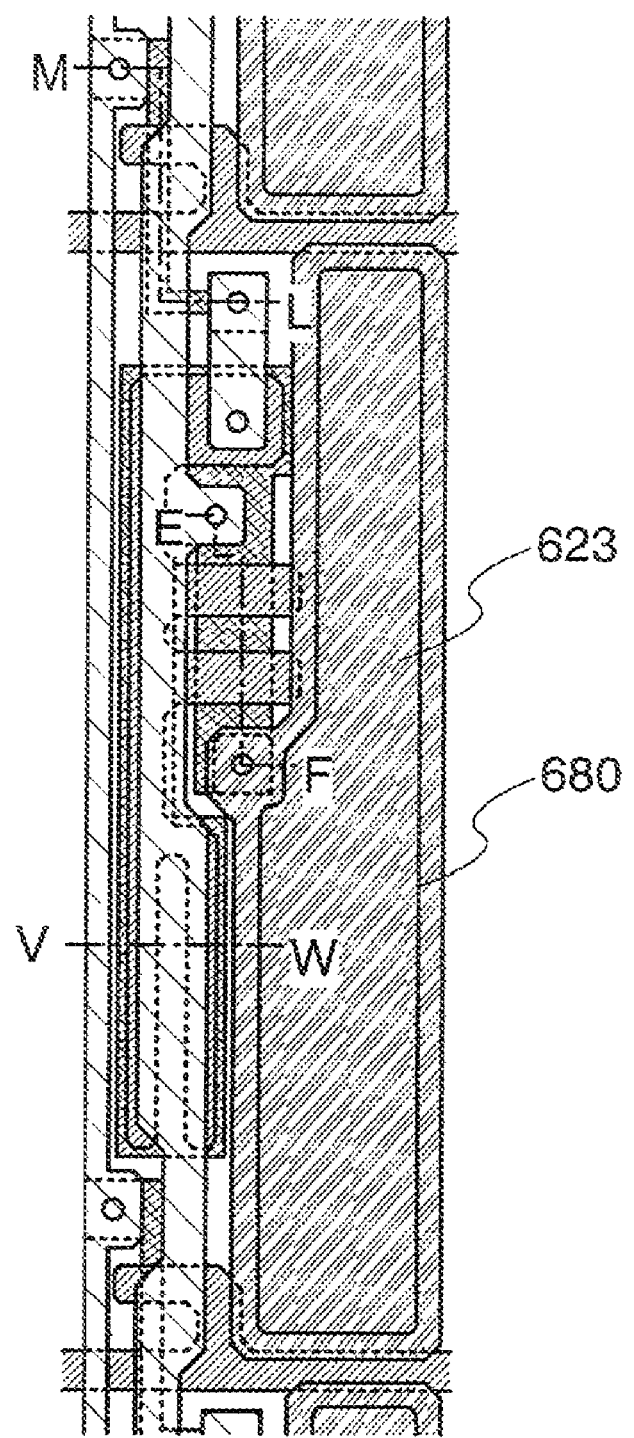
FIG. 11 is a diagram showing a structure of a pixel portion of the active matrix EL display device (Embodiment Mode 6)

In addition, FIG. 11 shows a top view of the pixel portion, and the cross section along the chained line E-F in FIG. 11 corresponds to the cross section structure of the p-channel TFT 639 in the pixel portion in FIG. 8. In addition, the cross section along the chained line M-L in FIG. 11 corresponds to the cross section structure of the n-channel TFT 638 in the pixel portion in FIG. 8. It is to be noted that the solid line denoted by reference numeral 680 in FIG. 11 shows a rim of the insulator 629. However, only the second conductive layer is shown in FIG. 11, and the first conductive layer is not shown in the figure.

Figure 12A:
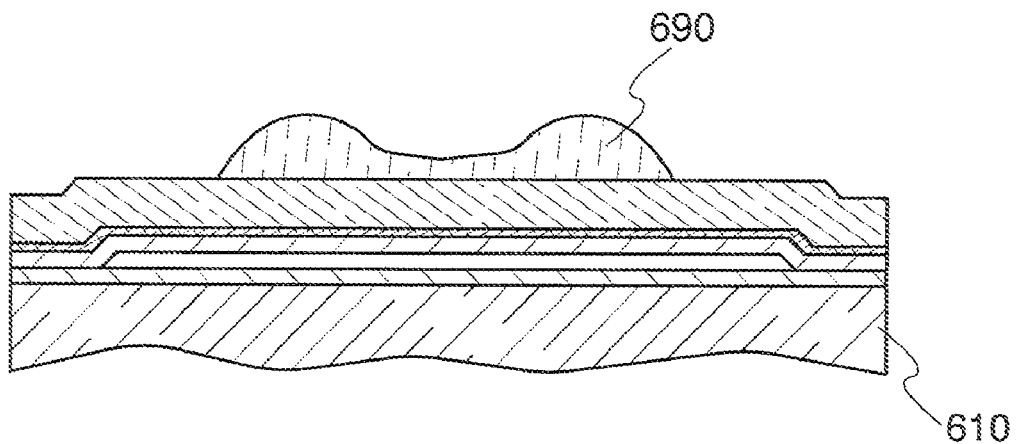
FIGS. 12A and 12B are cross-sectional views showing a portion (a capacitor portion) of the pixel portion of the active matrix EL display device (Embodiment Mode 6)
Figure 12B:
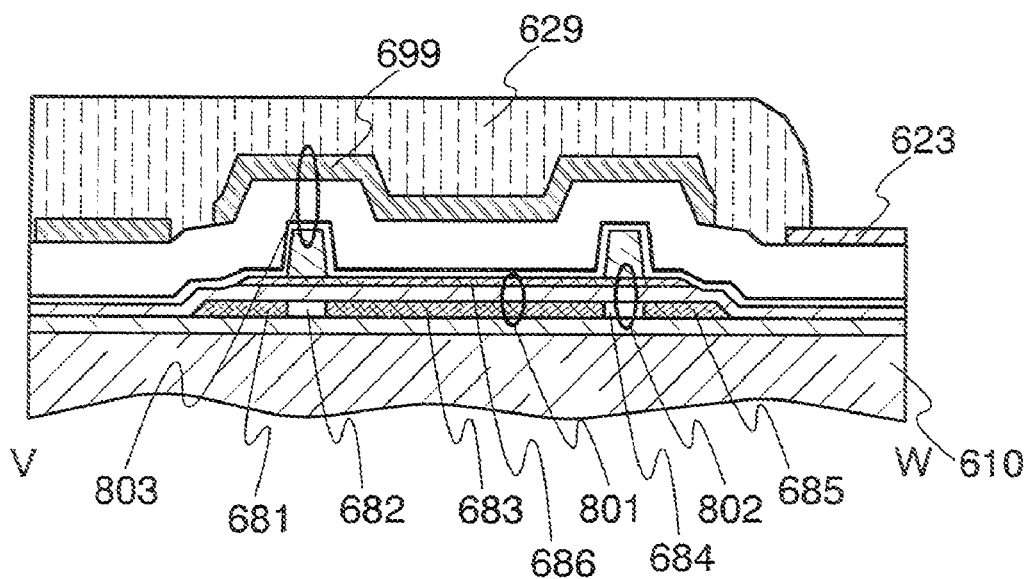

In addition, the cross section along the chained line V-W in FIG. 11 is shown in FIG. 12B. In FIG. 12B, the same portions as those in FIG. 8 are denoted by the same reference numerals. As shown in FIG. 12B, a first capacitor 801, a second capacitor 802, and a third capacitor 803 are formed. The first capacitor 801 is a capacitor formed by the phosphorus-doped semiconductor layers 681, 683, and 685 and the first conductive layer 686 with the gate insulating layer as a dielectric. In addition, the second capacitor 802 is a capacitor formed by the semiconductor layers (the semiconductor layers 682 and 684 that have the same impurity concentrations as those of the channel forming regions of the TFT) and the first conductive layer 686 with the gate electrode as a dielectric. In addition, the third capacitor 803 is a capacitor formed by the second conductive layer and a power line 699 with the interlayer insulating film as a dielectric.

In the capacitor portion, a photomask or a reticle provided with an assist pattern that is composed of a diffraction grating pattern or a semi-transparent film and has a function of reducing a light intensity is used for forming a resist pattern 690 as shown in FIG. 12A. By doping the semiconductor layer with phosphorous through the first conductive layer, increase in the first capacitor 801 is attempted.

Note that, in FIG. 12B, the cross section structure immediately after forming the insulator 629 is shown.

In accordance with the processes described above, the pixel portion, the driver circuit, and the terminal portion can be formed on the same substrate.

In the present embodiment mode, the TFTs in the pixel portion have double-gate structures for reducing off current, and the distance between the two channel forming regions is narrowed in accordance with Embodiment Mode 1 or 4 to reduce the occupied area of the TFTs.

In addition, the light-emitting display surface in the light-emitting device may be one or both sides of the light-emitting device. When the first electrode 623 and the second electrode 625 are formed by using transparent conductive films, light from the light-emitting element passes through both of the substrate 610 and the sealing substrate 633 and is extracted from the both sides. In this case, it is preferable to use transparent materials for the sealing substrate 633 and a filling material 627.

Alternatively, when the second electrode 625 is formed by using a metal film and the first electrode 623 is formed by using a transparent conductive film, a structure of transmitting light from the light-emitting element through only the substrate 610 to extract the light from one side, that is, a bottom emission type is provided. In this case, it is unnecessary to use a transparent material for the sealing substrate 633 or the filling material 627.

Alternatively, when the first electrode 623 is formed by using a metal film and the second electrode 625 is formed by using a transparent conductive film, a structure of transmitting light from the light-emitting element through only the sealing substrate 633 to extract the light from one side, that is, a top emission type is provided. In this case, it is unnecessary to use a transparent material for the substrate 610.

In addition, it is necessary that the materials for the first electrode 623 and the second electrode 625 being selected in consideration of work function. However, the first electrode and the second electrode both can serve as an anode or a cathode depending on the pixel structure. When the polarity of the driving TFT is a p-channel type, the first electrode and the second electrode are preferably an anode and a cathode, respectively. Alternatively, when the polarity of the driving TFT is an n-channel type, the first electrode and the second electrode are preferably a cathode and an anode, respectively.

Figure 10:
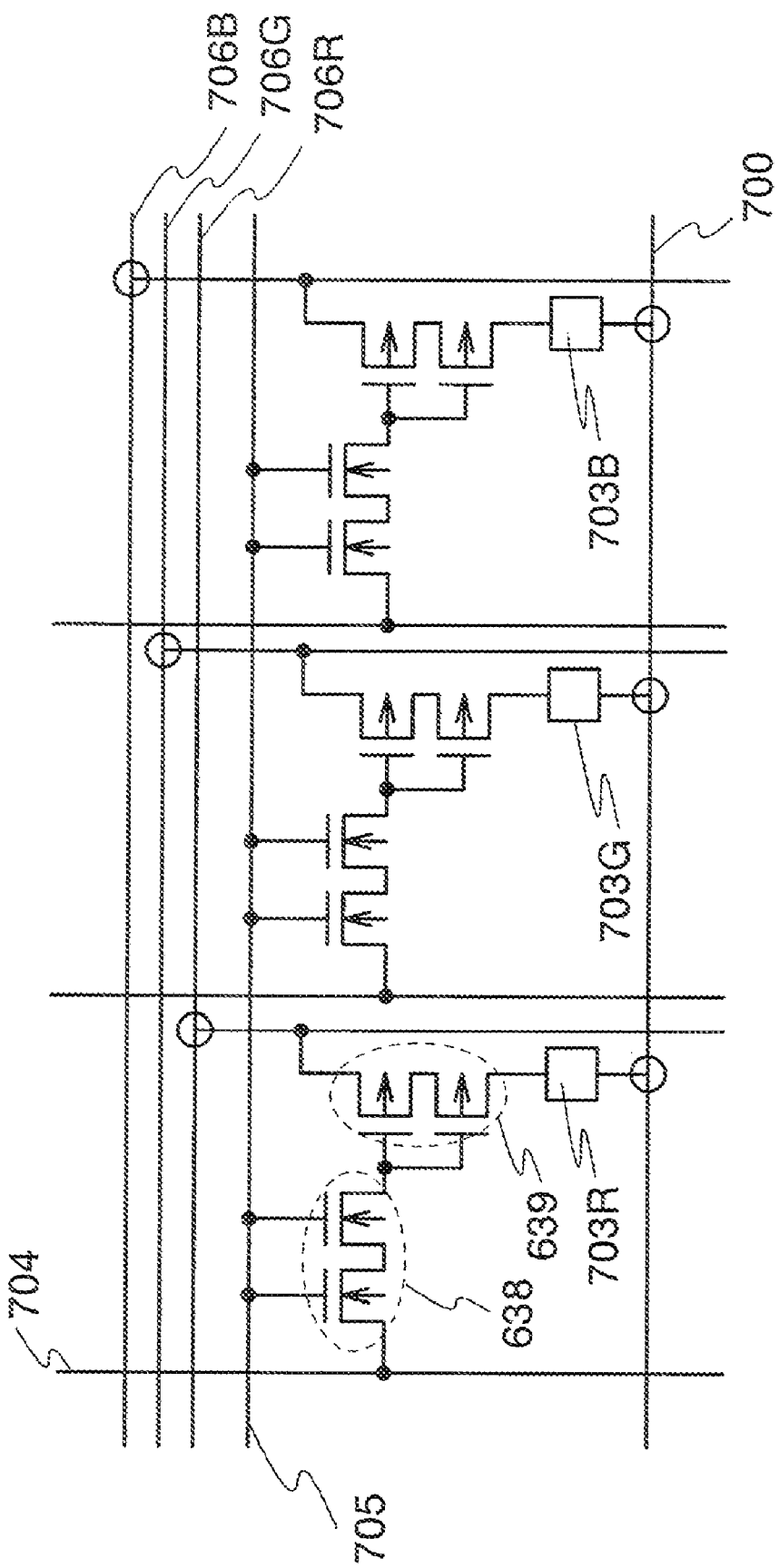
FIG. 10 is a diagram showing an equivalent circuit of a pixel portion of the active matrix EL display device (Embodiment Mode 6)

In addition, as for the case of full-color display, FIG. 10 shows an equivalent circuit diagram in a pixel portion according to the present embodiment mode. TFTs 638 and 639 in FIG. 8 correspond to the switching TFT 638 and the current control TFT 639 in FIG. 10, respectively. In a pixel for displaying a red color, an OLED 703R that produces red luminescence is connected to a drain region of the current control TFT 639, and an anode side power supply line (R) 706R is provided to a source region thereof. Further, a cathode side power supply line 700 is provided to the OLED 703R. In addition, in a pixel for displaying a green color, an OLED 703G that produces green luminescence is connected to a drain region of the current control TFT, and an anode side power supply line (G) 706G is provided to a source region thereof. In addition, in a pixel for displaying a blue color, an OLED 703B that produces blue luminescence is connected to a drain region of the current control TFT, and an anode side power supply line (B) 706B is provided to a source region thereof. Different voltages are applied to the respective different pixels for the different colors depending on the EL materials.

In addition, in the light-emitting device, the driving method of the screen display is not particularly limited, and for example, a dot sequential driving method, a line sequential driving method, a field sequential driving method, and the like may be used. Typically, while employing a line sequential driving method, a time-division gray-scale driving method or an area gray-scale driving method may be appropriately used. In addition, image signals that are input to source lines of the light-emitting device may be analog signals or may be digital signals, and the driver circuit and the like may be designed appropriately in accordance with the image signals.

Further, in the light-emitting device using digital video signals, a video signal that is input to a pixel has a constant voltage (CV) or a constant current (CC). When the video signal has a constant voltage (CV), a signal that is applied to the light-emitting element has a constant voltage (CVCV) or has a constant current (CVCC). In addition, when the video signal has a constant current (CC), a signal that is applied to the light-emitting element has a constant voltage (CCCV) or has a constant current (CCCC).

In addition, in the light-emitting device, a protective circuit (such as a protective diode) for preventing electrostatic breakdown may be provided.

The present embodiment mode can be freely combined with Embodiment Mode 1, 2, 3, 4, or 5.

Embodiment Mode 7

In the present embodiment mode, an example of a light-emitting device that is partially different in layout of a pixel from Embodiment Mode 6 will be described below with reference to FIGS. 13A and 13B, FIGS. 14A and 14B, and FIG. 15.

Figure 13A:
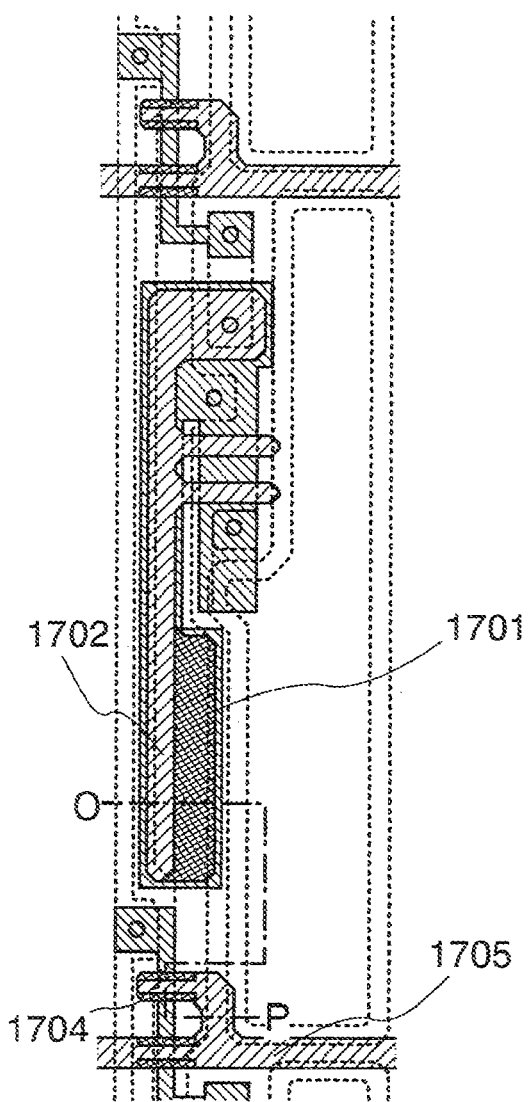
FIGS. 13A and 13B are a top view and a cross-sectional view in the middle of manufacturing of an active matrix EL display device (Embodiment Mode 7)

FIG. 13A is a top view of a pixel portion immediately after semiconductor layers, an insulating film (a gate insulating film) covering the semiconductor layers, and a conductive laminated pattern composed of a first conductive layer and a second conductive layer are formed over a substrate with an insulating surface.

Figure 13B:
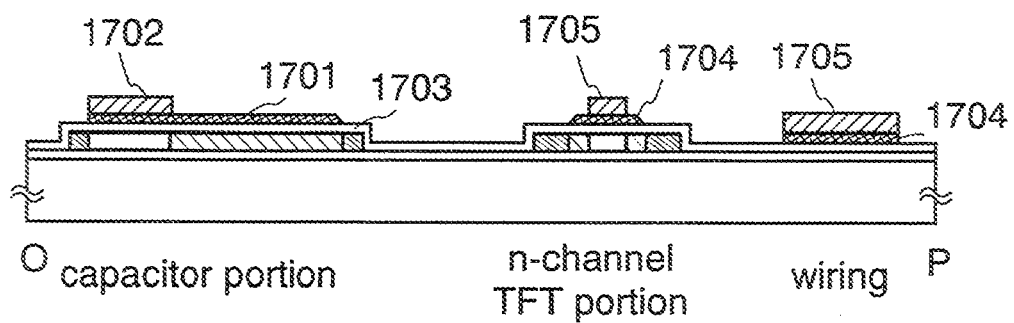

It is FIG. 13B that is a cross-sectional view corresponding to the cross section structure along the chained line O-P in FIG. 13A.

In the present embodiment mode, a photomask or a reticle provided with an assist pattern that is composed of a diffraction grating pattern or a semi-transparent film and has a function of reducing a light intensity is used to form a first conductive layer 1701 with a portion that is not overlapped with a second conductive layer 1702. For example, as shown in FIG. 13B, for a wiring on a gate insulating film 1703 that is not overlapped with the semiconductor layer, a first conductive layer 1704 and a second conductive layer 1705 have ends conformed to each other.

In addition, in an n-channel TFT portion that is placed in a pixel portion, in a portion overlapping with the semiconductor layer, the first conductive layer 1704 has a larger width than the second conductive layer 1705 and has a portion that is not overlapped with the second conductive layer 1705 in order to form an LDD region overlapping with the first conductive layer 1704.

In addition, in a capacitor portion, the ends of the first conductive layer 1701 and the second conductive layer 1702 on one side are conformed to each other while there is the first conductive layer that is not overlapped with the second conductive layer on the other side. The width of the first conductive layer that is not overlapped with the second conductive layer in the capacitor portion is wider than the width of the first conductive layer that is not overlapped with the second conductive layer in the n-channel TFT portion. Note that, the ends of the first conductive layer 1701 and the second conductive layer 1702 on the one side do not conform to each other in the capacitor portion in some etching conditions. It is preferable the gap between the ends in the capacitor portion would be within a distance of a portion of the first conductive layer 1704 in the n-type thin film transistor not overlapped by the second conductive layer 1705.

In the capacitor portion, the semiconductor layer overlapping with the first conductive layer is doped with an impurity element that gives an n-type conductivity through the first conductive layer 1701, and functions as one electrode of the capacitor.

In addition, in a p-channel TFT that is disposed in the pixel portion, ends of the first conductive layer and the second conductive layer that are overlapped with the semiconductor layer with the gate insulating film interposed therebetween are conformed to each other.

In this way, wirings and electrodes that have first conductive layers and second conductive layers with various cross-sectional shapes can be designed on the same substrate.

Subsequent processes are carried out in accordance with Embodiment Mode 6 up to the process of forming contact holes to reach the semiconductor layers for the interlayer insulating film.

Then, a third conductive layer, a fourth conductive layer, and a fifth conductive layer are laminated on the interlayer insulating film. It is to be noted that the third conductive layer, the fourth conductive layer, and the fifth conductive layer are formed continuously in the same metal sputtering system.

In the present embodiment mode, it is also a feature that a photomask or a reticle provided with an assist pattern that is composed of a diffraction grating pattern or a semi-transparent film and has a function of reducing a light intensity is used to carry out patterning for wirings to be formed on the interlayer insulating film.

A resist pattern in which a portion that is overlapped with an electrode 1623 to be formed later is thinner in film thickness than the other portion is formed with a photomask provided with an assist pattern that is composed of a diffraction grating pattern or a semi-transparent film and has a function of reducing a light intensity.

Etching is carried out with this resist pattern as a mask to form a connecting electrode that has a portion where the third conductive layer 1640 is present as a single layer and a portion where the third conductive layer 1640, the fourth layer, and the fifth layer 1641 are present as laminated layers. As the third conductive layer 1640 and the fifth conductive layer 1641, a high melting point metal element or a high melting point metal compound may be used, and for example, titanium or molybdenum is used. In addition, as the fourth conductive layer, an aluminum only or an aluminum alloy is used. This connecting electrode is electrically connected to the semiconductor layer of the p-channel TFT 1639. Further, electrodes that function as source electrodes or drain electrode of the TFTs are also formed in the same way as the connecting electrode.

In accordance with the processes described above, top gate TFTs 1636, 1637, 1638, and 1639 that have polysilicon films as active layers can be manufactured over the same substrate.

It is to be noted that the TFT 1638 that is placed in a pixel portion is an n-channel TFT that has a plurality of channel forming regions in a TFT. The TFT 1638 is a double-gate TFT. In addition, the TFT 1639 that is electrically connected to a light-emitting element to be formed later is provided in the pixel portion. In the TFT 1639, ends of the first conductive layer and the second conductive layer that are overlapped with the semiconductor layer with the gate insulating film interposed therebetween are conformed to each other. In addition, a double-gate p-channel TFT is shown here as the TFT 1639 for reducing off current. However, the TFT 1639 is not particularly limited, and may be a single-gate TFT.

In addition, the TFT 1636 that is placed in a driver circuit portion is an n-channel TFT with a lower concentration impurity region (also referred to as an LDD region) overlapping with the gate electrode, and the TFT 1637 is a p-channel TFT. The TFTs 1636 and 1637 are both TFTs that have single-gate structures. In the driver circuit portion, complementary connection between the TFT 1636 and the TFT 1637 allows a CMOS circuit to be made up, and allows various kinds of circuit to be achieved. Alternatively, the TFTs 1636 and 1637 may be multi-gate TFTs if necessary. In the TFT 1637, ends of the first conductive layer and the second conductive layer that are overlapped with the semiconductor layer with the gate insulating film interposed therebetween are conformed to each other, and the first conductive layer has a larger width than the second conductive layer and has a portion that is not overlapped with the second conductive layer.

Then, after forming a transparent conductive film, patterning is carried out to form an electrode 1623 that serves as one electrode of a light-emitting element. As the first electrode 1623, a transparent conductive film composed of a light-transmitting conductive material may be used, and an indium oxide containing a tungsten oxide, an indium zinc oxide containing a tungsten oxide, an indium oxide containing a titanium oxide, an indium tin oxide containing a titanium oxide, and the like can be used. Of course, an indium tin oxide (ITO), an indium zinc oxide (IZO), and an indium tin oxide doped with a silicon oxide (ITSO), and the like can be also used. The electrode 1623 is electrically connected to the third conductive layer 1640 of a connecting electrode. It is to be noted that the electrode 1623 has no contact with the fourth conductive layer or the fifth conductive layer 1641.

Then, an insulator 1629 for separating the adjacent electrodes 1623 is formed.

Figure 14A:
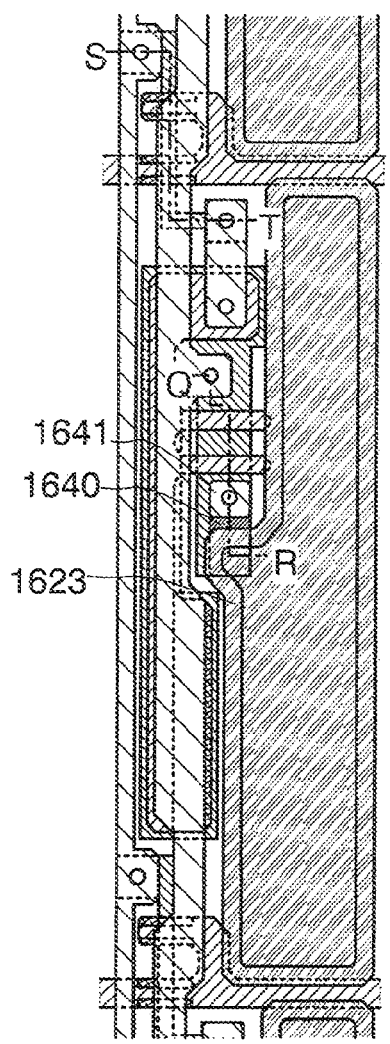
FIGS. 14A and 14B are cross-sectional views showing the structure of the active matrix EL display device (Embodiment Mode 7)
Figure 14B:
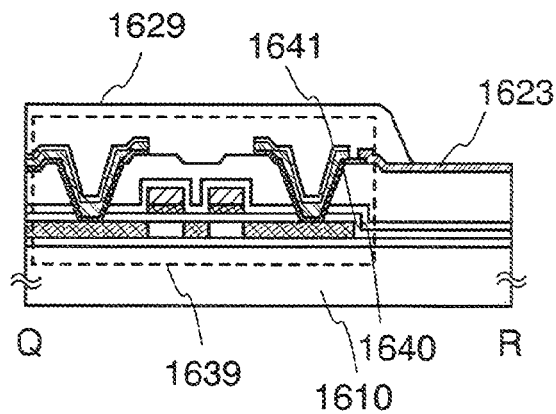

FIG. 14A shows a top view at the stage with the insulator 1629 formed. In addition, the cross-sectional view along the chained line Q-R in FIG. 14A is FIG. 14B.

In subsequent processes, an organic compound layer 1624 and an electrode 1625 that serves as the other electrode of the light-emitting element are formed in accordance with Embodiment Mode 6.

Then, a protective film 1626 is formed by evaporation or sputtering in the same way as in Embodiment Mode 6.

Then, sealing of the light-emitting element is carried out by attaching a sealing substrate 1633 with a sealing material 1628 in the same way as in Embodiment Mode 6. Further, the region surrounded by the sealing material 1628 is filled with a filling material 1627. Alternatively, the region surrounded by the sealing material 1628 is filled with a dried inert gas.

Finally, an FPC 1632 is attached to a terminal electrode with an anisotropic conductive film 1631 by a known method. (FIG. 15)

Figure 15:
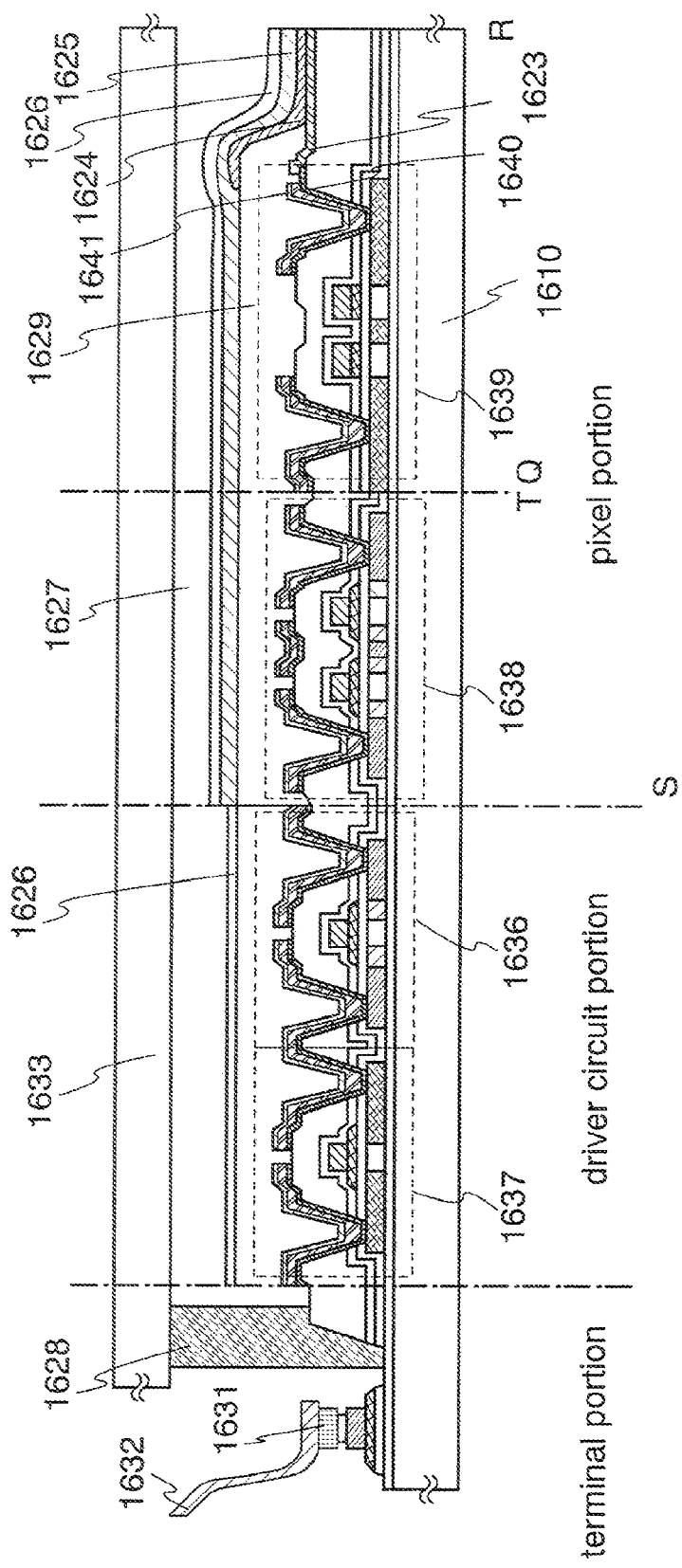
FIG. 15 is a cross-sectional view showing the structure of the active matrix EL display device (Embodiment Mode 7)

In addition, the cross-sectional view along the chained line S-T in FIG. 14A corresponds to an n-channel TFT in a pixel portion in FIG. 15.

The present embodiment mode can be freely combined with Embodiment Mode 1, 2, 3, 4, 5, or 6.

Embodiment Mode 8

Examples of mounting an FPC or a driver IC for driving on a light-emitting display panel will be described here with reference to FIGS. 16A and 16B.

Figure 16A:
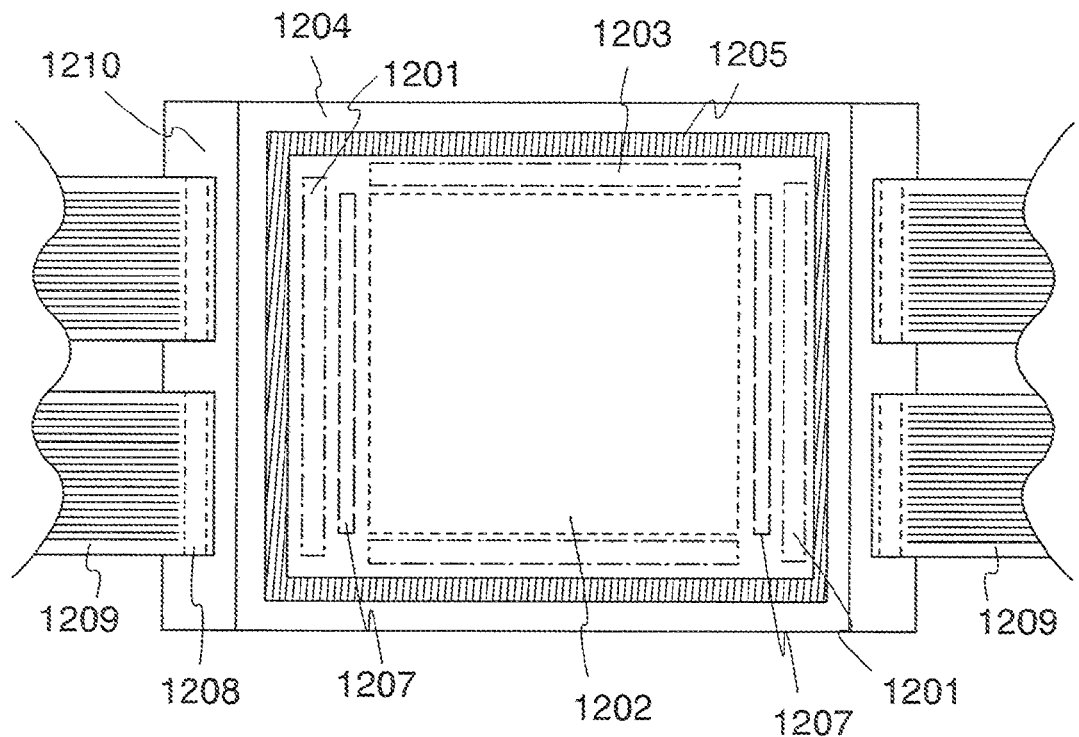
FIGS. 16A and 16B are diagrams showing examples of EL modules.

The drawing shown in FIG. 16A shows an example of a top view of a light-emitting device that has FPCs 1209 attached to four terminal portions 1208. A pixel portion 1202 including light-emitting elements and TFTs, a gate driver circuit 1203 including TFTs, and a source driver circuit 1201 including TFTs are formed on a substrate 1210. The active layers of the TFTs are composed of semiconductor films that have crystalline structures, and these circuits are formed on the same substrate. Therefore, an EL display panel achieving system-on-panel can be manufactured.

It is to be noted that the substrate 1210 is covered with a protective film except contact portions, and a base layer including a material that has a photocatalytic function is provided on the protective film.

In addition, connecting regions 1207 provided in two positions to sandwich the pixel portion are provided for making a second electrode of light-emitting elements to have contact with a lower wiring. It is to be noted that first electrodes of the light-emitting elements are electrically connected to the TFTs provided in the pixel portion.

In addition, a sealing substrate 1204 is attached to the substrate 1210 with a sealing material 1205 surrounding the pixel portion and the driver circuits and a filling material surrounded by the sealing material. Alternatively, the light-emitting display panel may have a structure filled with a filling material including a transparent drying agent. Alternatively, a drying agent may be provided in a region that is not overlapped with the pixel portion.

Figure 16B:
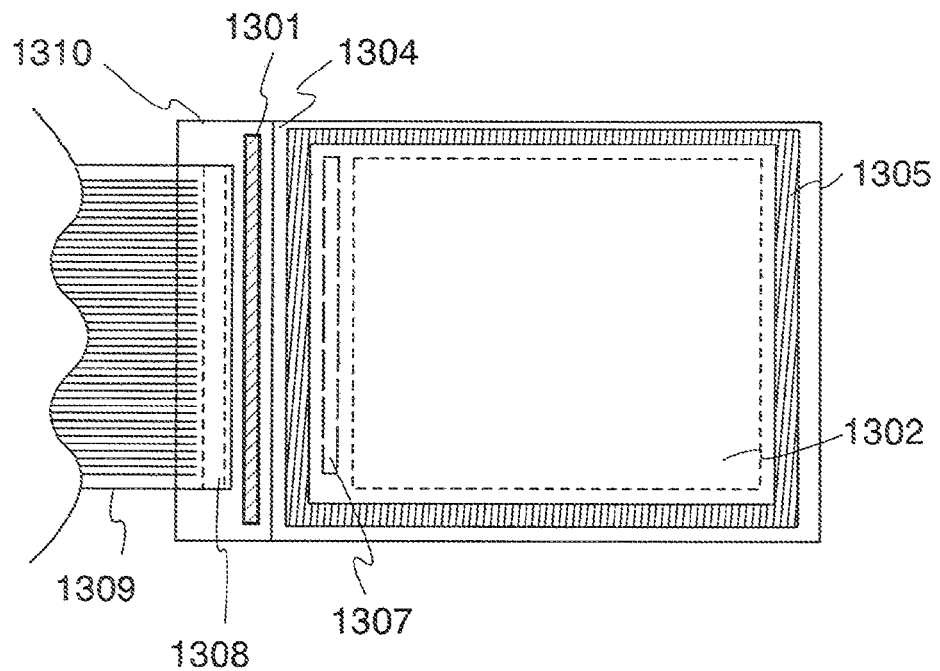

In addition, while the structure shown in FIG. 16A shows an example that is preferred in a relatively large-sized (for example, 4.3 inches diagonal) light-emitting device in the XGA class, FIG. 16B shows an example of employing a COG method that is preferred in a small size (for example, 1.5 inches diagonal) with a frame narrowed.

In FIG. 16B, a driver IC 1301 is provided on a substrate 1310, and an FPC 1309 is mounted on a terminal portion 1308 placed beyond the driver IC. As for the driver IC 1301 that is mounted, from the perspective of improving productivity, it is preferable to form a plurality of driver ICs on a rectangular substrate 300 mm to 1000 mm or more on a side, namely, a plurality of circuit patterns each including a driver circuit portion and an input/output terminal as one unit can be formed on a substrate and finally divided to take out driver ICs individually. As for the length of the longer side of the driver IC, the driver IC may be formed to have a rectangular shape with a longer side of 15 to 80 mm and a shorter side of 1 to 6 mm in consideration of the length of one side of the pixel portion and the pixel pitch, or may be formed so that the longer side has a length equal to one side of the pixel region or a length that is obtained by adding one side of the pixel portion and one side of each driver circuit.

For the outside dimension, the driver IC has an advantage over an IC chip in the length of the longer side, the use of driver ICs formed to have longer sides of 15 to 80 mm requires a smaller number of driver ICs for mounting corresponding to the pixel portions than a case of using IC chips, and the yield in manufacturing can be therefore improved. In addition, when driver ICs are formed on a glass substrate, the productivity is not damaged since the driver ICs are not limited by the shape of the substrate that is used as a mother body. This is a great advantage as compared with a case of taking out IC chips from a circular silicon wafer.

Alternatively, a TAB method may be employed, and in that case, driver ICs may be mounted on a plurality of tapes attached. In the same way as in the case of the COG method, a single driver IC may be mounted on a single tape, and in this case, it is preferable to attach a metal piece or the like for fixing the driver IC in terms of the strength.

In addition, a connecting region 1307 provided between the pixel portion 1302 and the driver IC 1301 is provided for making second electrodes of light-emitting elements to have contact with a lower wiring. It is to be noted that first electrodes of the light-emitting elements are electrically connected to the TFTs provided in the pixel portion.

In addition, a sealing substrate 1304 is fixed to the substrate 1310 with a sealing material 1305 surrounding the pixel portion 1302 and a filling material surrounded by the sealing material.

When an amorphous semiconductor film is used as the active layers of the TFTs in a pixel portion, the configuration in FIG. 16B is employed even in the case of a large size since it is difficult to form a driver circuit on the same substrate.

Although an example of an active matrix light-emitting device is shown here as a display device, it will be obvious that the present invention can be applied to an active matrix liquid crystal display device. In an active matrix liquid crystal display device, display patterns are formed on a screen by driving pixel electrodes arranged in a matrix. Specifically, by applying a voltage between a selected pixel electrode and an opposed electrode corresponding to the pixel electrode, a liquid crystal layer disposed between the pixel electrode provided on an element substrate and the opposed electrode provided on an opposed substrate is optically modulated, and this optical modulation is recognized as display patterns by viewers. The opposed substrate and the element substrate are equally spaced, and the space is filled with a liquid crystal material. As for the liquid crystal material, a method of dropping the liquid crystal with the sealing material as a closed pattern under reduced pressure so as to prevent bubbles therein and attaching the both substrates may be used, or a dip method (a pumping method) of providing a sealing pattern with an opening, attaching the TFT substrate, and then injecting the liquid crystal by use of the capillary phenomenon may be used.

In addition, the present invention can be applied also to a liquid crystal display device using a field sequential driving method of using optical shutters without using color filters and making back light sources for three colors of RGB flash at high speeds.

As described above, various electronic devices can be completed after practicing the present invention, namely, mounting an FPC and a driver IC for driving on a panel using the manufacturing method or structure in any one of Embodiment Modes 1 to 7.

Embodiment Mode 9

In the present embodiment mode, the structure of a liquid crystal display device will be described with reference to the drawings.

Figure 17:
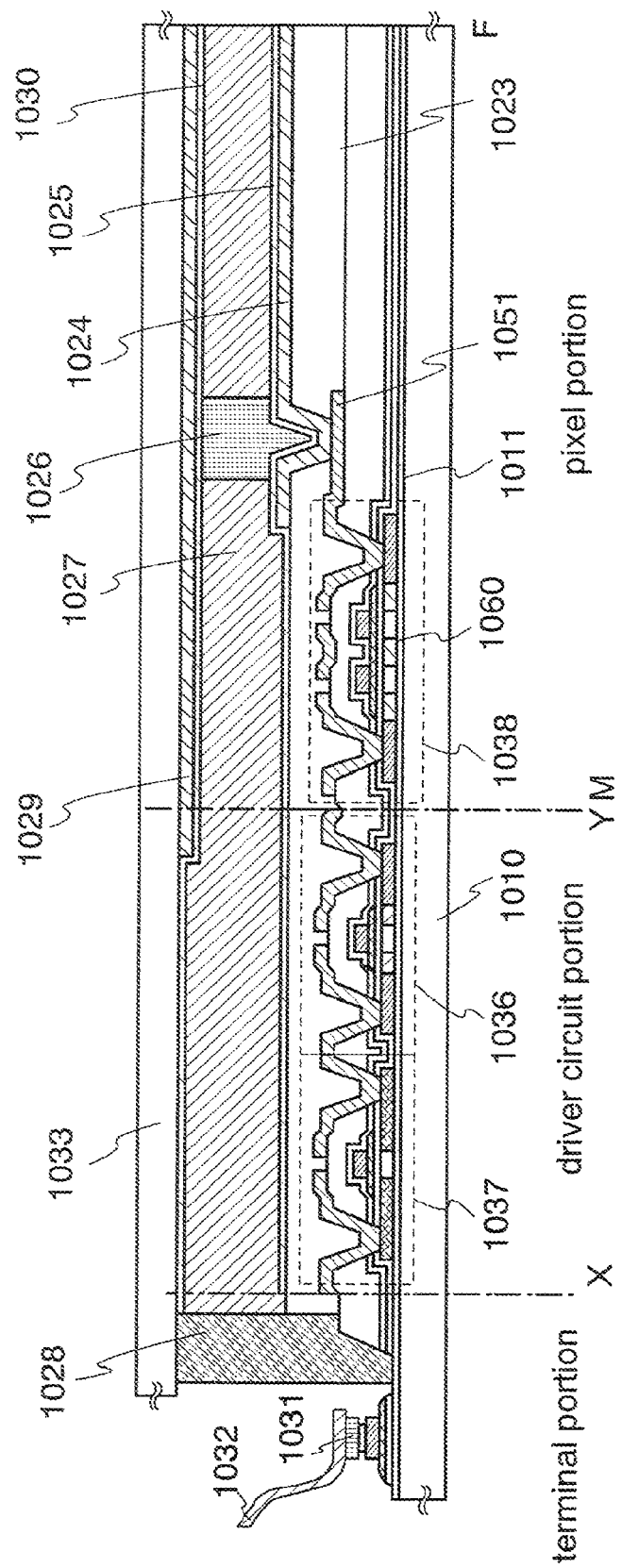
FIG. 17 is a cross-sectional view showing the structure of a liquid crystal display device.

In FIG. 17, a base insulating film 1011 is formed on a substrate 1010. As the substrate 1010, a light-transmitting glass substrate or quartz substrate may be used. Alternatively, a light-transmitting plastic substrate that has heat resistance for withstanding processing temperatures may be used. In addition, in the case of a reflective liquid crystal display device, a silicon substrate, a metal substrate, or a stainless-steel substrate with an insulating film formed on the surface thereof may be used besides the substrates described above. A glass substrate is used here as the substrate 1010.

As the base insulating film 1011, a base film of an insulating film such as a silicon oxide film, a silicon nitride film, or a silicon oxynitride film is formed. An example of using a single-layered structure as the base film is shown here. However, a laminated structure of two or more of the insulating films may be used. It is to be noted that it is not particularly necessary to form the base insulating film when asperity of the substrate or impurity diffusion from the substrate has no problem.

Alternatively, the surface of the substrate may be directly treated with microwave-excited high-density plasma that has an electron temperature of 2 eV or less, ion energy of 5 eV or less, and an electron density on the order of $10^{11}$ to $10^{13}/cm^3$. For generating the plasma, a microwave-excited plasma treatment system using a radial slot antenna can be used. In this case, when nitrogen ($N_2$) or a nitride gas such as ammonia ($NH_3$) or nitrous oxide ($N_2O$) is introduced, the surface of the glass substrate can be nitrided. This nitride layer formed on the surface of the glass substrate includes a silicon nitride as its main component, and can be therefore used as a blocking layer against impurities diffusing from the glass substrate side. A silicon oxide film or a silicon oxynitride film may be formed on this nitride layer by plasma CVD as the base layer 1011.

Then, semiconductor layers are formed on the base insulating film. The semiconductor layers are formed in such a way that patterning of a crystalline semiconductor film obtained by carrying out laser crystallization, thermal crystallization, thermal crystallization using a catalyst such as nickel, or the like as a crystallization process after forming a semiconductor film that has an amorphous structure by sputtering, LPCVD, plasma CVD, or the like is carried out into a desired shape with the use of a first photomask. It is to be noted that when plasma CVD is used, the base insulating film and the semiconductor film that had the amorphous structure can be formed continuously without being exposed to the air. This semiconductor layer is formed to have a thickness of 25 to 80 nm (preferably 30 to 70 nm). The material for the crystalline semiconductor film is not limited. However, the crystalline semiconductor film is preferably formed by using silicon, a silicon-germanium (SiGe) alloy, or the like.

If necessary, doping with a slight mount of impurity element (boron or phosphorous) is carried out to the semiconductor layers to control the threshold voltage of a TFT. For example, ion doping with plasma excitation diborane ($B_2H_6$) without mass separation can be used.

Then, an oxide film on the surface of the semiconductor layer is removed with an etchant containing hydrofluoric acid and at the same time, the surface of the semiconductor layer is cleaned with the etchant. Then, a gate insulating layer covering the semiconductor layer is formed. This gate insulating layer functions as a gate insulating film of the TFTs to be formed later. The gate insulating layer is formed by plasma CVD or sputtering to have a thickness of 1 to 200 nm. Preferably, the gate insulating layer is formed to be 10 to 50 nm thin by using a single layer or laminated structure that has an insulating film including silicon, and a surface nitridation treatment using microwave plasma is then carried out. In this case, the surface of the insulating film may be subjected to an oxidation or nitridation treatment to be made dense by a microwave-excited high density plasma treatment that has an electron temperature of 2 eV or less, ion energy of 5 eV or less, and an electron density on the order of $10^{11}$ to $10^{13}/cm^3$ as previously described. This treatment may be carried out before forming the gate insulating layer, namely, the plasma treatment is carried out to the surfaces of the semiconductor layers. In this case, by carrying out the treatment at a substrate temperature of 300 to 450° C. in an oxidizing atmosphere ($O_2$, $N_2O$, or the like) or a nitriding atmosphere ($N_2$, $NH_3$, or the like), a favorable interface can be formed between each semiconductor layer and the gate insulting layer that is deposited thereon.

Then, a first conductive film with a film thickness of 20 to 100 nm and a second conductive film with a film thickness of 100 to 400 nm are laminated on the gate insulating layer. In the present embodiment mode, a tantalum nitride film of 30 nm in film thickness and a tungsten film of 370 nm in film thickness are sequentially laminated on the gate insulating layer, and the patterning described in Embodiment Mode 1 is carried out to form respective electrodes and respective wirings. In the present embodiment mode, a photomask or a reticle provided with an assist pattern that is composed of a diffraction grating pattern or a semi-transparent film and has a function of reducing a light intensity is used to form the respective electrodes and the respective wirings. This aspect is the same as that described in Embodiment Mode 1.

It is to be noted that the conductive films are laminated layers of the tantalum nitride (TaN) film and the tungsten (W) film here, but not particularly limited, and may be formed by laminating layers each comprising at least one of Ta, W, Ti, Mo, Al, and Cu, or an alloy material or compound material including the element as its main component. Alternatively, a semiconductor film typified by a polycrystalline silicon film doped with an impurity element such as phosphorous may be used. In addition, the structure is not limited to the two-layer structure, and for example, may be a three-layer structure formed by sequentially laminating a tungsten film of 50 nm in film thickness, an aluminum-silicon (Al—Si) alloy film of 500 nm in film thickness, and a titanium nitride film of 30 nm in film thickness.

It is preferable to use ICP etching for etching of the first conductive film and the second conductive film (a first etching process and a second etching process). The films can be etched into a desired taper shape by using ICP etching and appropriately adjusting etching conditions (the electric power that is applied to a coiled electrode, the electric power that is applied to an electrode on the substrate side, the temperature of the electrode on the substrate side, and the like).

Then, for doping the semiconductor layers with an impurity element that gives an n-type conductivity, a first doping process of overall doping with the gate electrodes as masks is carried out. The first doping process may be carried out by ion doping or ion implantation. The ion doping is carried out under the condition that the dose is $1.5 \times 10^{13}$ atoms/$cm^2$ and the acceleration voltage is 50 to 100 kV. As the impurity element that gives an n-type conductivity, phosphorous (P) or arsenic (As) is typically used.

Then, after forming a mask of a resist, a second doping process is carried out for doping the semiconductor with a high concentration of impurity element that gives an n-type conductivity. The masks are provided in order not to dope for a channel forming region of the semiconductor layer for forming a p-channel TFT in a pixel portion and a peripheral portion thereof, a portion of an n-channel TFT in the pixel portion, and a channel forming region of the semiconductor layer for forming a p-channel TFT in a driver circuit portion, a peripheral portion thereof, and so on. Ion doping in the second doping process is carried out under the condition that the dose amount is $1 \times 10^{13}$ to $5 \times 10^{15}$ atoms/$cm^2$ and the acceleration voltage is 60 to 100 kV.

Then, a third doping process is carried out for doping the semiconductor with a high concentration of impurity element (typically, boron) that gives a p-type conductivity. The masks are provided in order not to dope for a channel forming region of the semiconductor layer for forming the n-channel TFT in the pixel portion and a peripheral portion thereof, a channel forming region of the semiconductor layer for forming an n-channel TFT in the driver circuit portion and a peripheral portion thereof, and so on.

By the processes described above, impurity regions that have the n-type or p-type conductivity type are formed in the respective semiconductor layers.

Then, an insulating film containing hydrogen is formed by using sputtering, LPCVD, plasma CVD, or the like. This insulating film is formed by using a silicon nitride or a silicon oxynitride. This insulating film includes a function as a protective film that prevents contamination of the semiconductor layers. After depositing this insulating film, hydrogen may be introduced into this insulating film by carrying out a microwave-excited high density plasma treatment as previously described while introducing hydrogen. Alternatively, both a nitride treatment for the insulating film and the introduction of hydrogen may be carried out by introducing ammonia gas. Alternatively, both an oxynitride treatment for the insulating film and the introduction of hydrogen may be carried out by introducing a gas such as oxygen or $NO_2$ gas and hydrogen gas. The surface of the insulating film can be made dense by carrying out a nitride treatment, an oxide treatment, or an oxynitride treatment in accordance with this method, thereby enhancing the function as the protective film. The hydrogen introduced into this insulating film can be released from the silicon nitride forming the insulating film to hydrogenate the semiconductor film 1060 by subsequently carrying out a heat treatment at 400 to 450° C.

Then, a first interlayer insulating film is formed by using sputtering, LPCVD, plasma CVD, or the like. For the first interlayer insulating film, a single layer or laminated layers of insulating films such as a silicon oxide film, a silicon nitride film, and a silicon oxynitride film. The first interlayer insulating film has a film thickness of 600 to 800 nm. Then, a mask of a resist is formed by using a photomask, and the first interlayer insulating film is selectively etched to form contact holes. Then, the mask of the resist is removed.

Then, after laminating metal films by sputtering, a mask of a resist is formed by using a photomask, and the metal laminated films are selectively etched to form electrodes that function as a source electrode or a drain electrode of a TFT. It is to be noted that the metal laminated films are formed continuously in the same metal sputtering system. Then, the mask of the resist is removed.

In accordance with the processes described above, top gate TFTs 1036, 1037, and 1038 that have polysilicon films as active layers can be manufactured over the same substrate.

It is to be noted that the TFT 1038 that is placed in a pixel portion is an n-channel TFT that has a plurality of channel forming regions in a TFT. The TFT 1038 is a multi-gate TFT.

In addition, the TFT 1036 that is placed in a driver circuit portion is an n-channel TFT with a lower concentration impurity region overlapping with the gate electrode, and the TFT 1037 is a p-channel TFT. The TFTs 1036 and 1037 are both TFTs that have single-gate structures. In the driver circuit portion, complementary connection between the TFT 1036 and the TFT 1037 allows a CMOS circuit to be made up, and allows various kinds of circuit to be achieved. Alternatively, the TFTs 1036 and 1037 may be multi-gate TFTs if necessary.

Then, a second interlayer insulating film 1023 is formed. The second interlayer insulating film 1023 is formed by spin coating using an organic resin insulating material such as a polyimide or an acrylic resin. This second interlayer insulating film 1023 has a function as a planarization film that prevents the surface from reflecting influences of asperity at the lower surface.

Then, a contact hole is formed in the second interlayer insulating film 1023 to expose a wiring 1051 connected to the n-channel TFT 1038 located below, and a pixel electrode 1024 is formed. As the pixel electrode 1024, a transparent conductive film composed of a light-transmitting conductive material may be used, and an indium oxide containing a tungsten oxide, an indium zinc oxide containing a tungsten oxide, an indium oxide containing a titanium oxide, an indium tin oxide containing a titanium oxide, and the like can be used. Of course, an indium tin oxide (ITO), an indium zinc oxide (IZO), and an indium tin oxide doped with a silicon oxide (ITSO), and the like can be also used.

Now, examples of the composition ratios of the respective light-transmitting conductive materials are described. The composition ratio of the indium oxide containing the tungsten oxide may be 1.0 wt % of tungsten oxide and 99.0 wt % of indium oxide. The composition ratio of the indium zinc oxide containing the tungsten oxide may be 1.0 wt % of tungsten oxide, 0.5 wt % of zinc oxide, and 98.5 wt % of indium oxide. The composition ratio of the indium oxide containing the titanium oxide may be 1.0 to 5.0 wt % of titanium oxide and 99.0 to 95.0 wt % of indium oxide. The composition ratio of the indium tin oxide (ITO) may be 10.0 wt % of tin oxide and 90.0 wt % of indium oxide. The composition ratio of the indium zinc oxide (IZO) may be 10.7 wt % of zinc oxide and 89.3 wt % of indium oxide. The composition ratio of the indium tin oxide containing the titanium oxide may be 5.0 wt % of titanium oxide, 10.0 wt % of tin oxide, and 85.0 wt % of indium oxide. The composition ratios described above are examples, and the percentages of the composition ratios may be appropriately set.

An orientation film 1025 is formed on the pixel electrode 1024. Also on an opposed substrate 1033, an opposed electrode 1029 is similarly formed by using a transparent conductive film composed of a light-transmitting material, and an orientation film 1030 is similarly formed thereon.

Then, the substrate 1010 and the opposed substrate 1033 with a distance therebetween are fixed with a sealing material 1028. The distance between these substrates is kept by a spacer 1026. A liquid crystal layer 1027 is formed between the substrate 1010 and the opposed substrate 1033. The liquid crystal layer 1027 may be formed by a dropping method before fixing the opposed substrate 1033.

Finally, an FPC 1032 is attached to a terminal electrode with an anisotropic conductive film 1031 by a known method (see FIG. 17). It is to be noted that it is preferable that a transparent conductive film that is obtained in the same process as that for the pixel electrode 1024 being used for the top layer of the terminal electrode, and the terminal electrode is an electrode that has a structure in which the transparent conductive film is formed on the conductive layer formed at the same time as the gate wiring.

Figure 18:
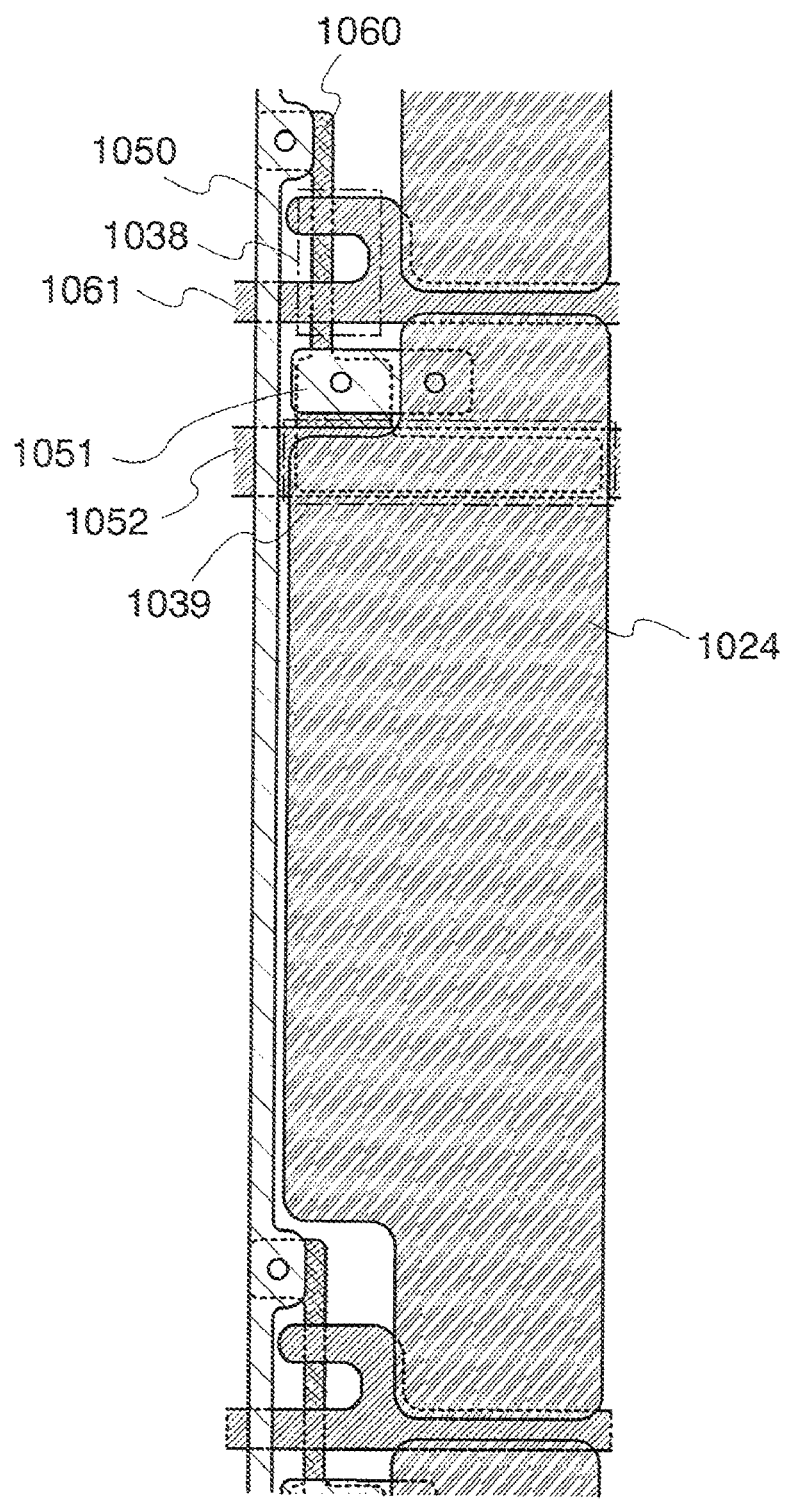
FIG. 18 is a diagram illustrating the structure of a pixel of the liquid crystal display device.

FIG. 18 shows a top view of the pixel portion corresponding to FIG. 17. A pixel is provided at an intersectional portion of a source signal line 1050 and a gate wiring 1061, and has the n-channel transistor 1038 and a capacitor element 1039. It is to be noted that only one electrode (the pixel electrode 1024) of the pair of electrodes that drive the liquid crystal of the liquid crystal element is shown in FIG. 18.

The n-channel transistor 1038 is made up of the semiconductor layer 1060, the first insulating layer, a portion of the gate wiring 1061 overlapping with the semiconductor layer 1060 with the first insulating layer interposed therebetween. The semiconductor layer 1060 forms the channel portion of the n-channel transistor 1038. One of a source and a drain of the n-channel transistor 1038 is connected to the source signal line 1050 by the contact hole, and the other is connected to the wiring 1051 by the contact hole. The wiring 1051 is connected the pixel electrode 1024 by the contact hole. The wiring 1051 can be formed by using the same conductive layer as the source signal line 1050 and carrying out patterning at the same time.

The capacitor element 1039 can be a capacitor element that has a structure using the semiconductor layer and a capacitor wiring 1052 overlapping with the semiconductor layer with the first insulating layer therebetween as a pair of electrodes and using and the first insulating layer as a dielectric layer.

Figure 19:
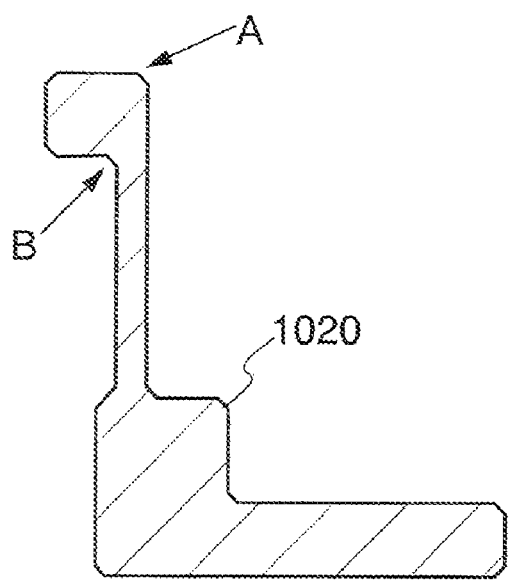
FIG. 19 is a diagram illustrating a mask pattern for light exposure.

In addition, the photomask for forming the semiconductor layer 1060 shown in FIG. 18 has a mask pattern 1020 shown in FIG. 19. This mask pattern 1020 differs according to whether the resist that is used in the photolithography process is positive or negative. In the case of using a positive resist, the mask pattern 1020 shown in FIG. 19 has, a shape with a top A of the polygon cut off. In addition, a flexion B has a shape flexed more than once to prevent the corner from being a right-angle corner. This photomask pattern has, for example, a corner cut off to the size of 10 μm or less on a side of the corner (right triangle) of the pattern.

The shape of the mask pattern 1020 shown in FIG. 19 is copied for the semiconductor layer 1060 shown in FIG. 18. In that case, a shape that is similar to the mask pattern 1020 may be transferred, or transfer may be carried out so that the corner of the mask pattern 1020 is further rounded, namely, the shape of the pattern may be smoothed more than the mask pattern 1020 to provide a rounded portion.

Figure 20:
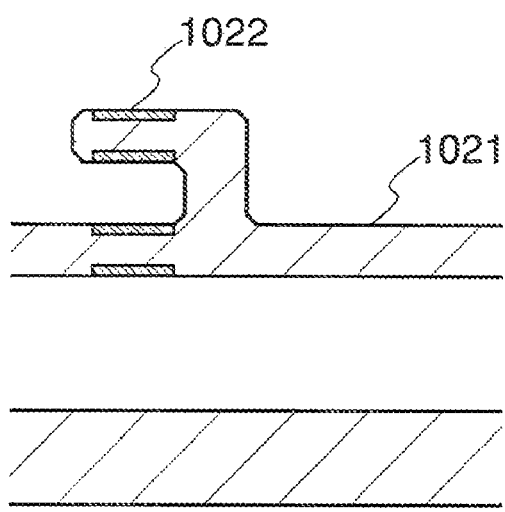
FIG. 20 is a diagram illustrating a light exposure mask pattern provided with an assist pattern.

In addition, the photomask for forming this gate wiring has a mask pattern 1021 shown in FIG. 20. This photomask pattern 1021 has a corner cut off to the size of 10 μm or less on a side of the corner (right triangle) of the pattern, or ⅕ or more and ½ or less of the line width of the wiring. Further, a site that is overlapped with the semiconductor layer has a light-shielding portion composed of a metal film such as Cr, and as an assist pattern, has a portion 1022 provided with a semi-transparent film as an assist pattern. This structure has the same structure as those described in FIGS. 5A to 5C.

The shape of the mask pattern 1021 shown in FIG. 20 is copied for the gate wiring 1061 shown in FIG. 18. In that case, a shape that is similar to the mask pattern 1021 may be transferred, or transfer may be carried out so that the corner of the mask pattern 1021 is further rounded, namely, the shape of the pattern may be smoothed more than the mask pattern 1021 to provide a rounded portion, namely, the corner of the gate wiring 1061 is made to be rounded to ⅕ or more and ½ or less of the line width thereof. The convex portion suppresses generation of fine powder due to abnormal electrical discharge during dry etching with plasma, and the concave portion has the advantage that improvement in yield can be tremendously expected as a result of sweeping away generated fine powder if any that easily gathers at the corner.

The photomask pattern for forming the source signal line 1050 and the wiring 1051 similarly has a shape with a corner chamfered to 10 μm or less on a side of the corner, or to a length of ⅕ or more and ½ or less of the line width of the wiring. This photomask pattern is used to manufacture a mask pattern, and the source signal line 1051 and the connecting wiring 1051 is carried out by etching using the mask pattern. The pattern of the source signal line 1050 and the connecting wiring 1051 may have a rounded corner, namely, the pattern shape of the source signal line 1050 and the wiring 1051 may be smoothed more than the photomask pattern by properly determining light exposure conditions and etching conditions. Thus, the source signal line 1050 and wiring 1051 with rounded corners are formed.

The following advantages are provided by smoothing a flexion or a corner of a site varying in wiring width to be made round in this way for a wiring or an electrode. Chamfering of a convex portion can suppress generation of fine powder due to abnormal electrical discharge when dry etching with plasma is carried out. In addition, chamfering of a concave portion can prevent generated fine powder if any from gathering at the corner and sweep away the fine powder when cleaning is carried out. Thus, the problem of dust and powder in the manufacturing process can be solved to improve the yield.

In accordance with the processes described above, the pixel portion, the driver circuit, and the terminal portion can be formed on the same substrate. In the present embodiment mode, the n-channel TFT in the pixel portion has a double-gate structure for reducing off current, and the distance between the two channel forming regions is narrowed to reduce the occupied area of the TFTs.

The present embodiment mode can be freely combined with Embodiment Mode 1, 2, 3, or 4.

Embodiment Mode 10

Examples of mounting an FPC or a driver IC for driving on a liquid crystal display panel that is obtained according to Embodiment Mode 9 will be described with reference to FIGS. 21A and 21B.

Figure 21A:
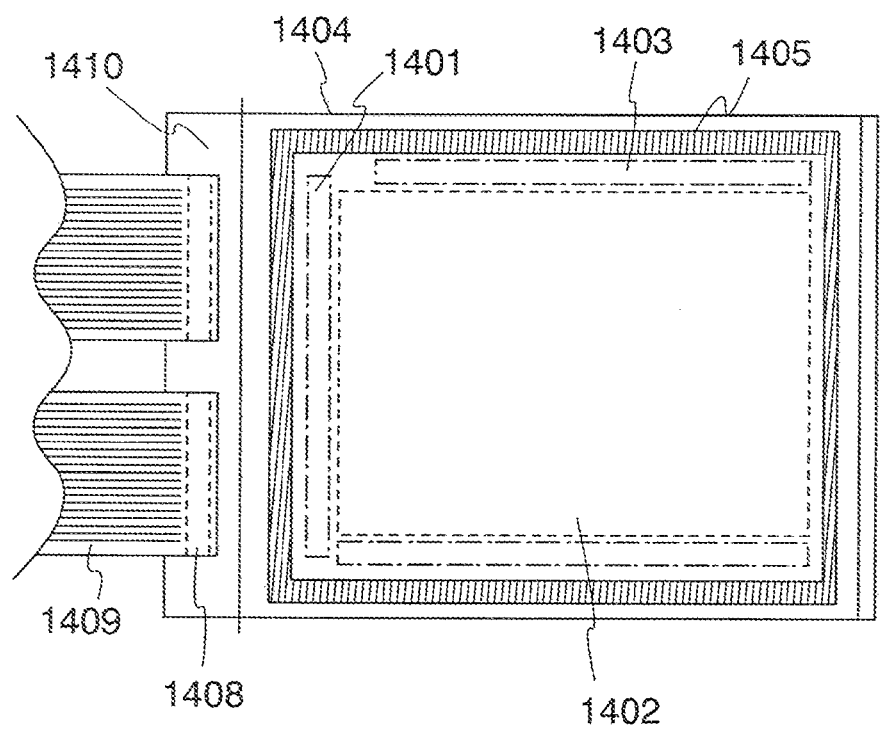
FIGS. 21A and 21B are diagrams showing examples of liquid crystal modules.

The drawing shown in FIG. 21A shows an example of a top view of a display device that has FPCs 1409 attached to two terminal portions 1408. A pixel portion 1402 including a liquid crystal layer and TFTs, a gate driver circuit 1403 including TFTs, and a source driver circuit 1401 including TFTs are formed on a substrate 1410. The active layers of the TFTs are composed of semiconductor films that have crystalline structures, and these circuits are formed on the same substrate. Therefore, a liquid crystal display panel achieving system-on-panel can be manufactured.

An opposed substrate 1404 is fixed to the substrate 1410 with a sealing material 1405 surrounding the pixel portion and the driver circuits. While the structure shown in FIG. 21A shows an example that is preferred in a relatively large-sized (for example, 4.3 inches diagonal) display device in the XGA class, FIG. 21B shows an example of employing a COG method that is preferred in a small size (for example, 1.5 inches diagonal) with a frame narrowed.

Figure 21B:
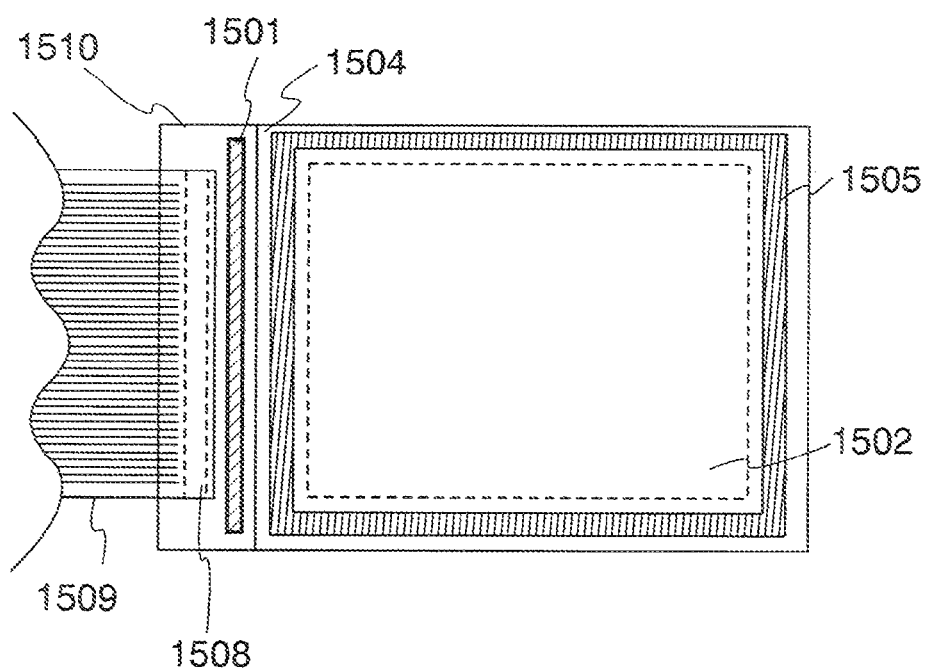

In FIG. 21B, a driver IC 1501 is provided on a substrate 1510, and an FPC 1509 is mounted on a terminal portion 1508 placed beyond the driver IC. As for the driver IC 1501 that is mounted, from the perspective of improving productivity, it is preferable to form a plurality of driver ICs on a rectangular substrate 300 mm to 1000 mm or more on a side, namely, a plurality of circuit patterns each including a driver circuit portion and an input/output terminal as one unit can be formed on a substrate and finally divided to take out driver ICs individually. As for the length of the longer side of the driver IC, the driver IC may be formed to have a rectangular shape with a longer side of 15 to 80 mm and a shorter side of 1 to 6 mm in consideration of the length of one side of the pixel portion and the pixel pitch, or may be formed so that the longer side has a length equal to one side of the pixel region or a length that is obtained by adding one side of the pixel portion and one side of each driver circuit.

For the outside dimension, the driver IC has an advantage over an IC chip in the length of the longer side, the use of driver ICs formed to have longer sides of 15 to 80 mm requires a smaller number of driver ICs for mounting corresponding to the pixel portions than a case of using IC chips, and the yield in manufacturing can be therefore improved. In addition, when driver ICs are formed on a glass substrate, the productivity is not damaged since the driver ICs are not limited by the shape of the substrate that is used as a mother body. This is a great advantage as compared with a case of taking out IC chips from a circular silicon wafer.

Alternatively, a TAB method may be employed, and in that case, driver ICs may be mounted on a plurality of tapes attached. In the same way as in the case of the COG method, a single driver IC may be mounted on a single tape, and in this case, it is preferable to attach a metal piece or the like for fixing the driver IC in terms of the strength.

In addition, an opposed substrate 1504 is fixed to the substrate 1510 with a sealing material 1505 surrounding a pixel portion 1502.

As described above, various electronic devices can be completed after practicing the present invention, namely, mounting an FPC and a driver IC for driving on a panel using the manufacturing method or structure in any one of Embodiment Modes 1 to 5 and so on.

Embodiment Mode 11

Semiconductor devices and electronic devices according to the present invention include a camera such as a video camera or a digital camera, a goggle-type display (a head mount display), a navigation system, a sound reproduction system (such as an in-car audio system), a laptop personal computer, a game machine, a personal digital assistant (such as a mobile computer, a cellular phone, a portable game machine, or an electronic book), and an image reproduction system provided with a recording medium (specifically, a system provided with a display that can reproduce a recording medium such as a Digital Versatile Disc (DVD) and display the image). FIGS. 22(A) to 22(D) and FIG. 23 show specific examples of those electronic devices.

Figure 22A:
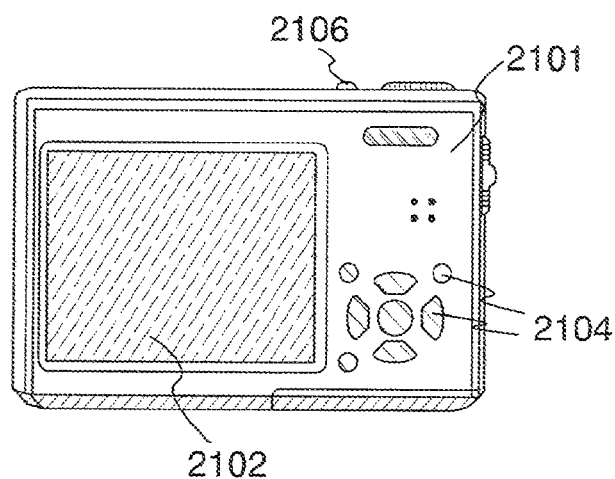
FIGS. 22A to 22D are diagrams showing examples of electronic devices.

FIG. 22A is a digital camera, which includes a main body 2101, a display portion 2102, an imaging portion, operation keys 2104, a shutter 2106, and the like. It is to be noted that FIG. 22A is a diagram as seen from the display portion 2102 side, and the imaging portion is not shown. The present invention allows a digital camera that has a high-definition display portion with high reliability to be achieved.

Figure 22B:
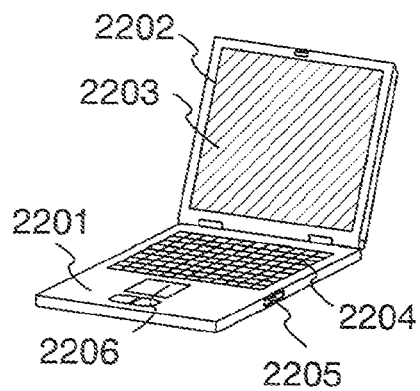

FIG. 22B is a laptop personal computer, which includes a main body 2201, a housing 2202, a display portion 2203, a keyboard 2204, an external connection port 2205, a pointing mouse 2206, and the like. The present invention allows a laptop personal computer that has a high-definition display portion with high reliability to be achieved.

Figure 22C:
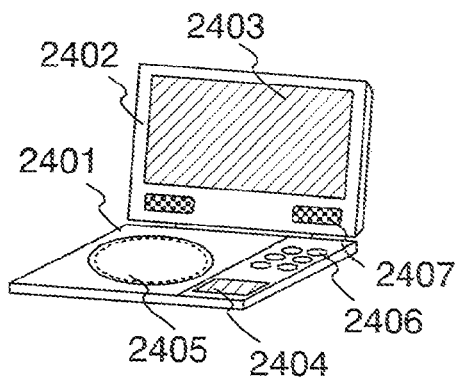

FIG. 22C is a portable image reproduction system provided with a recording medium (specifically, a DVD reproduction system), which includes a main body 2401, a housing 2402, a display portion A 2403, a display portion B 2404, a recording medium (such as a DVD) reading portion 2405, an operation key 2406, a speaker portion 2407, and the like. The display portion A 2403 displays mainly image information, while the display portion B 2404 displays mainly character information. It is to be noted that the image reproduction system provided with a recording medium includes a home game machine. The present invention allows an image reproduction system that has a high-definition display portion with high reliability to be achieved.

Figure 22D:
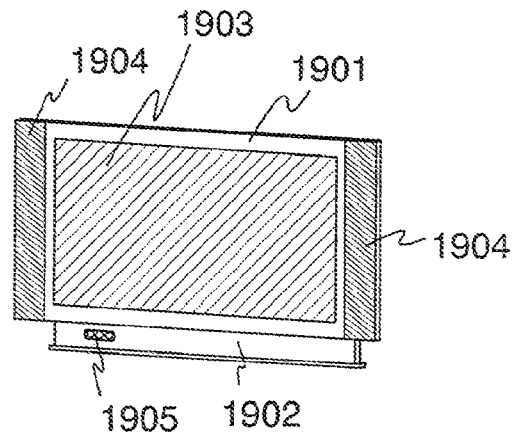

FIG. 22D is a display device, which includes a housing 1901, a support 1902, a display portion 1903, a speaker 1904, a video input terminal 1905, and the like. This display device is manufactured by using thin film transistors formed in accordance with the manufacturing method shown in the embodiment modes described above for the display portion 1903 and a driver circuit. It is to be noted that the display device includes a liquid crystal display device and a light-emitting device, and specifically, includes all display devices for displaying information, such as for computers, for receiving televisions, and for displaying advertisements. The present invention allows a display device, in particular, a large-sized display device that has a large screen of 22 to 50 inches, that has a high-definition display portion with high reliability to be achieved.

Figure 23:
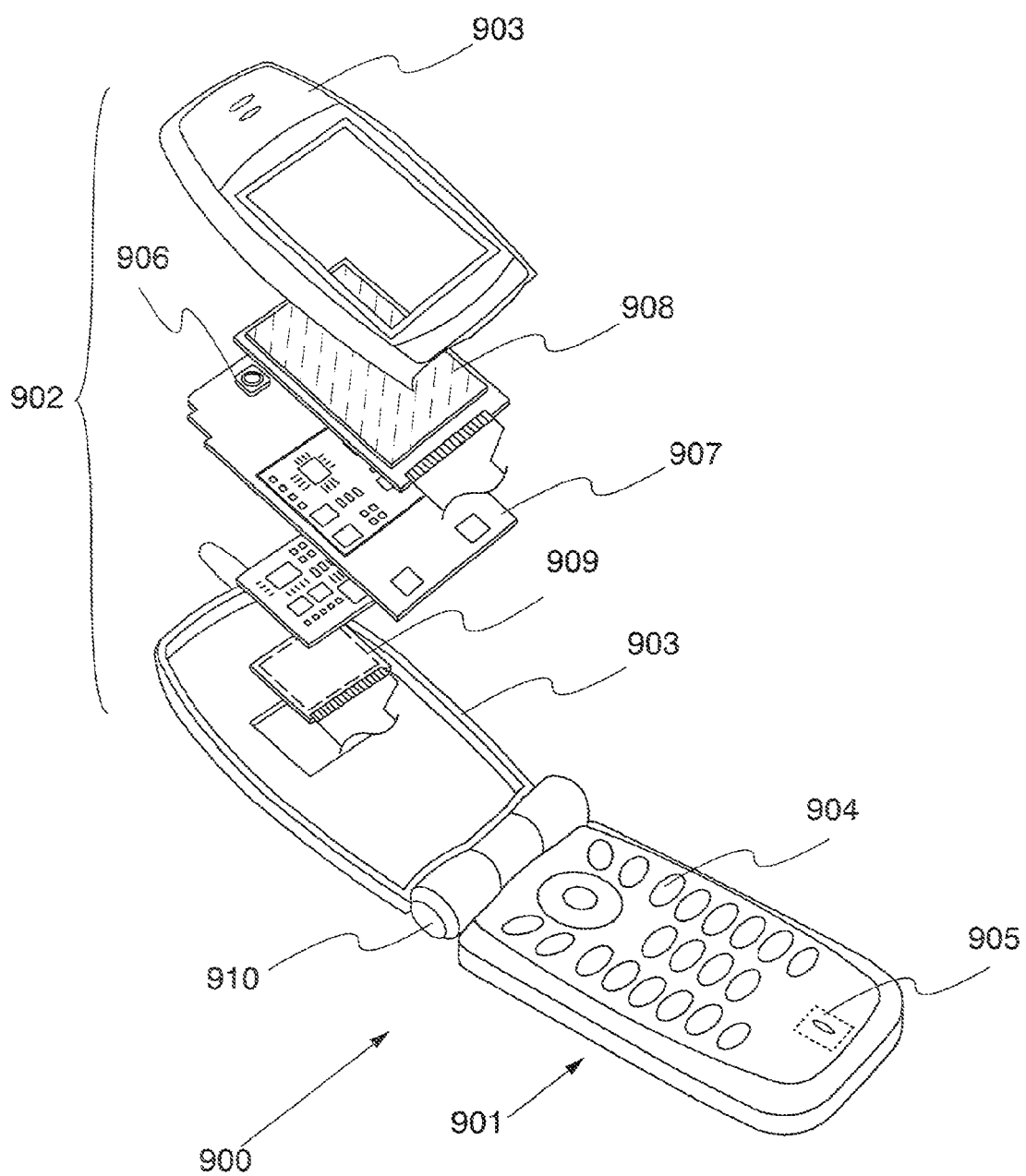
FIG. 23 is a diagram showing an example of electronic device.

The cellular phone shown in FIG. 23 has a main body (A) provided with operation switches 904, a microphone 905, and the like and a main body (B) provided with a display panel (A) 908, a display panel (B) 909, a speaker 906, and the like, which are coupled with a hinge 910 to be openable and closable. The display panel (A) 908 and the display panel (B) 909 are put in a housing 903 of the main body (B) 902 along with a circuit substrate 907. Pixel portions of the display panel (A) 908 and the display panel (B) 909 are placed to be visible from an open window formed in the housing 903.

The specifications of the display panel (A) 908 and the display panel (B) 909, such as the number of the pixels, can be appropriately set according to functions of the cellular phone( ). For example, the display panel (A) 908 and the display panel (B) 909 can be combined as a main screen and a sub-screen, respectively.

The present invention allows a personal digital assistant that has a high-definition display portion with high reliability to be achieved.

The cellular phone according to the present embodiment mode can be changed into various modes depending on the functions and applications thereof. For example, a cellular phone with a camera may be made by incorporating an image sensor into the portion of the hinge 910. Also when the operation switches 904, the display panel (A) 908, and the display panel (B) 909 are put in one housing for an integrated structure, the effects described above can be achieved. Also when the present embodiment mode is applied to a personal digital assistant provided with a plurality of display portions, the same effects can be obtained.

As described above, various electronic devices can be completed by practicing the present invention, namely, using the manufacturing method or structure in any one of Embodiment Modes 1 to 10.

This application is based on Japanese Patent Application serial No. 2005-148836 filed in Japan Patent Office on May, 20, 2005 and Japanese Patent Application serial no. 2005-150271 filed in Japan Patent Office on May, 23, 2005, the entire contents of which are hereby incorporated by reference.

What is claimed is:

1. A method for manufacturing a semiconductor device comprising the steps of:
    forming an insulating film on a semiconductor layer;
    forming a first conductive film on the insulating film;
    forming a second conductive film on the first conductive film;
    forming a resist pattern on the second conductive film having end portions and a central portion that are thinner than remaining portions of the resist pattern from a cross-sectional view;
    etching the second conductive film and the first conductive film to form a first conductive pattern from the first conductive film and a plurality of second conductive patterns from the second conductive film, the plurality of second conductive patterns being located apart from each other on the first conductive pattern;
    doping the semiconductor layer with an impurity element by using the first conductive pattern and the plurality of second conductive patterns as masks to form a pair of first impurity regions in the semiconductor layer, both of the first impurity regions being located outside the first conductive pattern; and
    doping the semiconductor layer with an impurity element by using the plurality of second conductive patterns as masks to form second impurity regions in the semiconductor layer, the second impurity regions being overlapped with the first conductive pattern.

2. The method for manufacturing the semiconductor device according to claim 1, wherein the width of the first conductive pattern is wider than the sum of the widths of the plurality of second conductive patterns.

3. The method for manufacturing the semiconductor device according to claim 1, wherein the resist pattern is formed by using a photomask or a reticle that has a diffraction grating pattern or a semi-transparent film.

4. The method for manufacturing the semiconductor device according to claim 1, wherein the first conductive pattern and the plurality of second conductive patterns serve as a gate electrode.

5. The method for manufacturing the semiconductor device according to claim 1, wherein the second impurity regions are LDD regions.

6. The method for manufacturing the semiconductor device according to claim 1, wherein the pair of first impurity regions are a source region and a drain region.

7. A method for manufacturing a semiconductor device comprising the steps of:
- forming a first insulating film on a substrate;
- forming a semiconductor layer on the first insulating film;
- forming a second insulating film on a semiconductor layer;
- forming a first conductive film on the second insulating film;
- forming a second conductive film on the first conductive film;
- forming a resist pattern on the second conductive film having end portions and a central portion that are thinner than remaining portions of the resist pattern from a cross-sectional view;
- etching the second conductive film and the first conductive film to form a first conductive pattern from the first conductive film and a plurality of second conductive patterns from the second conductive film, the plurality of second conductive patterns being located apart from each other on the first conductive pattern;
- doping the semiconductor layer with an impurity element by using the first conductive pattern and the plurality of second conductive patterns as masks to form a pair of first impurity regions in the semiconductor layer, both of the first impurity regions being located outside the first conductive pattern;
- doping the semiconductor layer with an impurity element by using the plurality of second conductive patterns as masks to form second impurity regions in the semiconductor layer, the second impurity regions being overlapped with the first conductive pattern;
- forming a third insulating film over the first conductive pattern and the plurality of second conductive patterns;
- forming a source electrode and a drain electrode over the third insulating film; and
- forming a pixel electrode connected to one of the source electrode and the drain electrode.

8. The method for manufacturing the semiconductor device according to claim 7, wherein the width of the first conductive pattern is wider than the sum of the widths of the plurality of second conductive patterns.

9. The method for manufacturing the semiconductor device according to claim 7, wherein the resist pattern is formed by using a photomask or a reticle that has a diffraction grating pattern or a semi-transparent film.

10. The method for manufacturing the semiconductor device according to claim 7, wherein the first conductive pattern and the plurality of second conductive patterns serve as a gate electrode.

11. The method for manufacturing the semiconductor device according to claim 7, wherein the second impurity regions are LDD regions.

12. The method for manufacturing the semiconductor device according to claim 7, wherein the pair of first impurity regions are a source region and a drain region.

13. A method for manufacturing a semiconductor device comprising the steps of:
- forming an insulating film on a semiconductor layer;
- forming a First conductive Film on the insulating film;
- forming a second conductive film on the first conductive film;
- forming a resist pattern on the second conductive film having a concave upper surface;
- etching the second conductive film and the first conductive film to form a first conductive pattern from the first conductive film and a plurality of second conductive patterns from the second conductive film, the plurality of second conductive patterns being located apart from each other on the first conductive pattern;
- doping the semiconductor layer with an impurity element by using the first conductive pattern and the plurality of second conductive patterns as masks to form a pair of first impurity regions in the semiconductor layer, both of the first impurity regions being located outside the first conductive pattern; and
- doping the semiconductor layer with an impurity element by using the plurality of second conductive patterns as masks to form second impurity regions in the semiconductor layer, the second impurity regions being overlapped with the first conductive pattern.

14. The method for manufacturing the semiconductor device according to claim 13, wherein the width of the first conductive pattern is wider than the sum of the widths of the plurality of second conductive patterns.

15. The method for manufacturing the semiconductor device according to claim 13, wherein the resist pattern is formed by using a photomask or a reticle that has a diffraction grating pattern or a semi-transparent film.

16. The method for manufacturing the semiconductor device according to claim 13, wherein the first conductive pattern and the plurality of second conductive patterns serve as a gate electrode.

17. The method for manufacturing the semiconductor device according to claim 13, wherein the second impurity regions are LDD regions.

18. The method for manufacturing the semiconductor device according to claim 13, wherein the pair of first impurity regions are a source region and a drain region.

19. A method for manufacturing a semiconductor device comprising the steps of:
- forming a first insulating film on a substrate;
- forming a semiconductor layer on the first insulating film;
- forming a second insulating film on a semiconductor layer;
- forming a first conductive film on the insulating film;
- forming a second conductive film on the first conductive film;
- forming a resist pattern on the second conductive film having a concave upper surface;
- etching the second conductive film and the first conductive film to form a first conductive pattern from the first conductive film and a plurality of second conductive patterns from the second conductive film, the plurality of second conductive patterns being located apart from each other on the first conductive pattern;
- doping the semiconductor layer with an impurity element by using the first conductive pattern and the plurality of second conductive patterns as masks to form a pair of first impurity regions in the semiconductor layer, both of the first impurity regions being located outside the first conductive pattern;
- doping the semiconductor layer with an impurity element by using the plurality of second conductive patterns as masks to form second impurity regions in the semiconductor layer, the second impurity regions being overlapped with the first conductive pattern;

forming a third insulating film over the first conductive pattern and the plurality of second conductive patterns;

forming a source electrode and a drain electrode over the third insulating film; and forming a pixel electrode connected to one of the source electrode and the drain electrode.

20. The method for manufacturing the semiconductor device according to claim 19, wherein the width of the first conductive pattern is wider than the sum of the widths of the plurality of second conductive patterns.

21. The method for manufacturing the semiconductor device according to claim 19, wherein the resist pattern is formed by using a photomask or a reticle that has a diffraction grating pattern or a semi-transparent film.

22. The method for manufacturing the semiconductor device according to claim 19, wherein the first conductive pattern and the plurality of second conductive patterns serve as a gate electrode.

23. The method for manufacturing the semiconductor device according to claim 19, wherein the second impurity regions are LDD regions.

24. The method for manufacturing the semiconductor device according to claim 19, wherein the pair of first impurity regions are a source region and a drain region.

* * * * *

UNITED STATES PATENT AND TRADEMARK OFFICE
CERTIFICATE OF CORRECTION

| | |
|---|---|
| PATENT NO. | : 7,579,220 B2 |
| APPLICATION NO. | : 11/383694 |
| DATED | : August 25, 2009 |
| INVENTOR(S) | : Ohnuma et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 501 days.

Signed and Sealed this

Fourteenth Day of September, 2010

David J. Kappos
*Director of the United States Patent and Trademark Office*